(12) United States Patent
Nara et al.

(10) Patent No.: US 9,178,155 B2
(45) Date of Patent: Nov. 3, 2015

(54) FLEXIBLE SUBSTRATE, MANUFACTURING METHOD OF DISPLAY ELEMENT, AND MANUFACTURING APPARATUS OF DISPLAY ELEMENT

(75) Inventors: Kei Nara, Yokohama (JP); Tomohide Hamada, Yokohama (JP); Masaki Kato, Yokohama (JP); Tohru Kiuchi, Higashi-Kurume (JP)

(73) Assignee: NIKON CORPORATION, Tokyo (JP)

( * ) Notice: Subject to any disclaimer, the term of this patent is extended or adjusted under 35 U.S.C. 154(b) by 656 days.

(21) Appl. No.: 12/576,752

(22) Filed: Oct. 9, 2009

(65) Prior Publication Data

US 2010/0143595 A1    Jun. 10, 2010

Related U.S. Application Data

(60) Provisional application No. 61/193,060, filed on Oct. 24, 2008.

(30) Foreign Application Priority Data

Oct. 10, 2008   (JP) .................................. 2008-263437

(51) Int. Cl.
*B05D 5/12* (2006.01)
*B65G 47/26* (2006.01)
*B65G 1/133* (2006.01)
(Continued)

(52) U.S. Cl.
CPC ................ *H01L 51/00* (2013.01); *H01L 51/52* (2013.01); *H01L 51/56* (2013.01); *H01L 2251/5338* (2013.01); *Y10T 428/24479* (2015.01)

(58) Field of Classification Search
USPC ........ 427/64, 66, 428.21, 209, 210, 211, 271, 427/275, 276, 299, 322; 264/119, 280, 284, 264/294, 296; 198/428; 414/751.1
See application file for complete search history.

(56) References Cited

U.S. PATENT DOCUMENTS

| | | |
|---|---|---|
| 6,919,680 B2 | 7/2005 | Shimoda et al. |
| 7,108,369 B2 | 9/2006 | Newsome et al. |

(Continued)

FOREIGN PATENT DOCUMENTS

| | | |
|---|---|---|
| JP | 01-115033 | 5/1989 |
| JP | H1-115033 | 5/1989 |

(Continued)

OTHER PUBLICATIONS

International Search Report dated Nov. 17, 2009 from the European Patent Office for corresponding European Patent Application No. PCT/JP2009/005137, (4 pgs.).

(Continued)

*Primary Examiner* — Austin Murata
(74) *Attorney, Agent, or Firm* — Finnegan, Henderson, Farabow, Garrett & Dunner, L.L.P.

(57) ABSTRACT

In a manufacturing apparatus of display element, a display element is formed in a flexible substrate that has a first surface and a second surface that is an opposite surface thereof, and this manufacturing apparatus of display element includes a transportation section that transports the flexible substrate in a predetermined direction that intersects with a width direction of the flexible substrate; a first partition wall formation section that forms a first partition wall for a display element in the first surface; and a second partition wall formation section that forms a second partition wall in the second surface.

19 Claims, 13 Drawing Sheets

(51) Int. Cl.
    *H01L 51/00*   (2006.01)
    *H01L 51/52*   (2006.01)
    *H01L 51/56*   (2006.01)

(56) References Cited

U.S. PATENT DOCUMENTS

| | | | |
|---|---|---|---|
| 8,163,214 B2* | 4/2012 | Mol | 264/167 |
| 2002/0067128 A1 | 6/2002 | Tsuruoka et al. | |
| 2002/0195928 A1* | 12/2002 | Grace et al. | 313/503 |
| 2003/0035199 A1 | 2/2003 | Liang et al. | |
| 2004/0190115 A1 | 9/2004 | Liang et al. | |
| 2005/0082147 A1 | 4/2005 | Mol | |
| 2005/0104253 A1* | 5/2005 | Katsumoto et al. | 264/284 |
| 2006/0083927 A1* | 4/2006 | Von Ehr, II | 428/408 |
| 2007/0031992 A1* | 2/2007 | Schatz | 438/107 |
| 2008/0254704 A1 | 10/2008 | Hamada et al. | |
| 2009/0039772 A1* | 2/2009 | Takashima et al. | 313/504 |
| 2009/0078544 A1* | 3/2009 | Messick et al. | 198/834 |

FOREIGN PATENT DOCUMENTS

| | | |
|---|---|---|
| JP | 11-238452 | 8/1999 |
| JP | 2002-170495 | 6/2002 |
| JP | 2003-263119 | 9/2003 |
| JP | 2005-500572 | 1/2005 |
| JP | 2005-93324 | 4/2005 |
| JP | 2005-093324 | 4/2005 |
| JP | 2007-059188 | 3/2007 |
| TW | 200714953 A | 4/2007 |
| TW | 200719015 A | 5/2007 |
| TW | 200732677 A | 9/2007 |
| WO | WO 03/016994 A1 | 2/2003 |
| WO | WO 2006/100889 | 9/2006 |
| WO | WO 2006/100889 A1 | 9/2006 |
| WO | WO 2007/004627 * | 1/2007 |

OTHER PUBLICATIONS

Written Opinion of the International Searching Authority dated Nov. 17, 2009 from the European Patent Office for corresponding European Patent Application No. PCT/JP2009/005137, (6 pgs.).
Office Action in the corresponding Japanese Patent Application No. 2010-532797 mailed on Dec. 3, 2013, (6 pages).
Office Action in the corresponding Japanese Patent Application No. 2010-532797 mailed on Dec. 3, 2013, (3 pages).
Office Action in the corresponding Taiwan Patent Application No. 098134226 mailed on Sep. 2, 2014 (28 pages).
International Search Report dated Nov. 17, 2009 for corresponding International Patent Application No. PCT/JP2009/005137, (4 pgs.).
Written Opinion of the International Searching Authority dated Nov. 17, 2009 for corresponding International Patent Application No. PCT/JP2009/005137, (6 pgs.).

* cited by examiner

FLEXIBLE SUBSTRATE, MANUFACTURING METHOD OF DISPLAY ELEMENT, AND MANUFACTURING APPARATUS OF DISPLAY ELEMENT

This application is a non-provisional application claiming priority to and the benefit of U.S. Provisional Application No. 61/193,060, filed on Oct. 24, 2008, and claims priority to Japanese Patent Application No. 2008-263437, filed on Oct. 10, 2008. The contents of these applications are incorporated herein.

BACKGROUND

1. Field of the Invention

The present application relates to manufacturing technique for a display element that forms a light emitting element or a circuit element. In particular, it relates to a flexible substrate in which a partition wall (bank) is formed by nano-imprinting, a manufacturing method of display element that manufactures a display element, and a manufacturing apparatus of display element.

2. Related Art

A display medium that utilizes liquid crystal or organic electroluminescence (EL) as a display element is widely used. For example, in the fabrication of an organic EL element, patterning of an electrode layer or an organic compound layer is performed. Methods of performing this patterning include a method of vapor depositing the organic compound via a shadow mask and a method of applying the organic compound with an ink jet.

In a vapor deposition apparatus, in order to obtain a uniform film, it is necessary to separate to some extent a substrate from the evaporation source. As the vapor deposition apparatus itself grows in size, the period required for exhausting each film formation chamber of the vapor deposition apparatus is prolonged. Moreover, since the vapor deposition apparatus is a structure that rotates the substrate, there is a limit in the vapor deposition apparatus aiming at a large area substrate. For this reason, as disclosed in U.S. Pat. No. 7,108,369, research and development into applying an organic compound by an ink jet is being actively promoted.

In the case of applying an organic compound with an ink jet, a partition wall (bank) is often formed so that the applied ink does not spread from a specified region. In U.S. Pat. No. 7,108,369, the ink is applied between a partition wall and a partition wall, but no disclosure is made regarding the fabrication of the partition wall. Generally, a partition wall is formed by a photolithography process. Specifically, the partition wall is manufactured in the following manner. That is, after coating a synthetic resin which has photosensitivity on the substrate to provide a photosensitive material layer (insulating layer), a mask that has a pattern is illuminated with exposure light, and the photosensitive material layer is exposed by the exposure light that passes the mask. Next, the partition wall is fabricated by a developing process.

Also, U.S. Pat. No. 7,108,369 discloses fabricating technique for organic EL using a flexible substrate. However, this fabricating technique involves manufacturing one sheet at a time. Since producing one sheet at a time requires cost, so U.S. Pat. No. 6,919,680 provides technique to fabricate an organic EL using a roll of a flexible substrate.

However, as provided in U.S. Pat. No. 6,919,680, when organic EL is fabricated using a roll of a flexible substrate, a reduction in manufacturing cost can be achieved, but pulling the flexible substrate between a plurality of rollers causes the tension of the flexible substrate to become uneven. The problem thus arises of the distance and angle in the flexible substrate gradually changing during transport of the flexible substrate.

SUMMARY

An embodiment of the present invention aims to provide a manufacturing apparatus of display element that can easily form partition walls on a first surface of a flexible substrate and suppresses changes in the distance and angle of the flexible substrate, and a method of manufacturing thereof.

In one embodiment, a manufacturing apparatus of display element forms a display element in a flexible substrate that has a first surface and a second surface that is an opposite surface thereof. This manufacturing apparatus of display element includes: a transportation section that transports a flexible substrate in a predetermined direction that intersects with a width direction of the flexible substrate; a first partition wall formation section that forms a first partition wall for a display element in the first surface; and a second partition wall formation section that forms a second partition wall in the second surface.

In another embodiment, a method for manufacturing a display element forms the display element in a flexible substrate that has a first surface and a second surface that is an opposite surface thereof. The method for manufacturing a display element includes: transporting the flexible substrate in a predetermined direction that intersects with a width direction of the flexible substrate; forming a first partition wall for a display element in the first surface; and forming a second partition wall in the second surface.

In the other embodiment, a flexible substrate has a first surface and a second surface that is an opposite surface thereof. The flexible substrate includes: a first partition wall for a display element that is formed in the first surface; and a second partition wall that is formed in the second surface.

In the other embodiment, a manufacturing apparatus of display element forms the display element in a flexible substrate that has a first surface and a second surface that is an opposite surface thereof. This manufacturing apparatus of display element includes: a processing section that performs a process at a predetermined position between first partition walls that are formed in the first surface; and a transportation section that is disposed opposite the processing section and that has a shape that engages with second partition walls that are formed in the second surface.

In the other embodiment, a method for manufacturing a display element forms a display element in a flexible substrate that has a first surface and a second surface that is an opposite surface thereof. The method for manufacturing a display element includes: forming a first partition wall for the display element in the first surface; forming a second partition wall in the second surface; and performing a process at a predetermined position between the first partition walls. The process was performed in a range in which a transportation section that has a shape engages with the second partition walls and the flexible substrate being contacted.

In the other embodiment, a method for manufacturing a display element forms the display element in a flexible substrate that has a first partition wall for a display element that is formed in a first surface and a second partition wall that is formed in a second surface that is an opposite surface of the first surface. This method for manufacturing a display element includes performing a process at a predetermined position between the first partition walls, wherein the performing the process performs the process in a range in which a transportation section that has a shape engages with the second partition wall and the flexible substrate being contacted.

In one embodiment of the present invention, in the method for manufacturing a display element or the apparatus for manufacturing a display element, since the second partition wall is formed, even if the flexible substrate expands or contracts, that expansion or contraction is corrected. By performing a process on the flexible substrate in which the expansion or contraction has been corrected, formation of the display element with high precision is possible. In particular, since the flexible substrate easily expands or contracts in a multiple pattern layout panel or larger panel, the effect of correcting the expansion or contraction is significant.

DESCRIPTION

The manufacturing apparatus of display element to be described in the present embodiment is an apparatus that can be applied to an organic EL element, a liquid crystal display element or a field emission display. In representation of these, the structure of an organic EL element and a fabrication apparatus (a manufacturing apparatus) of an organic EL element shall be described.

<Organic EL Element 50 of Field Effect Transistor>
<<Structure of Organic EL Element 50>>

Figure 1:
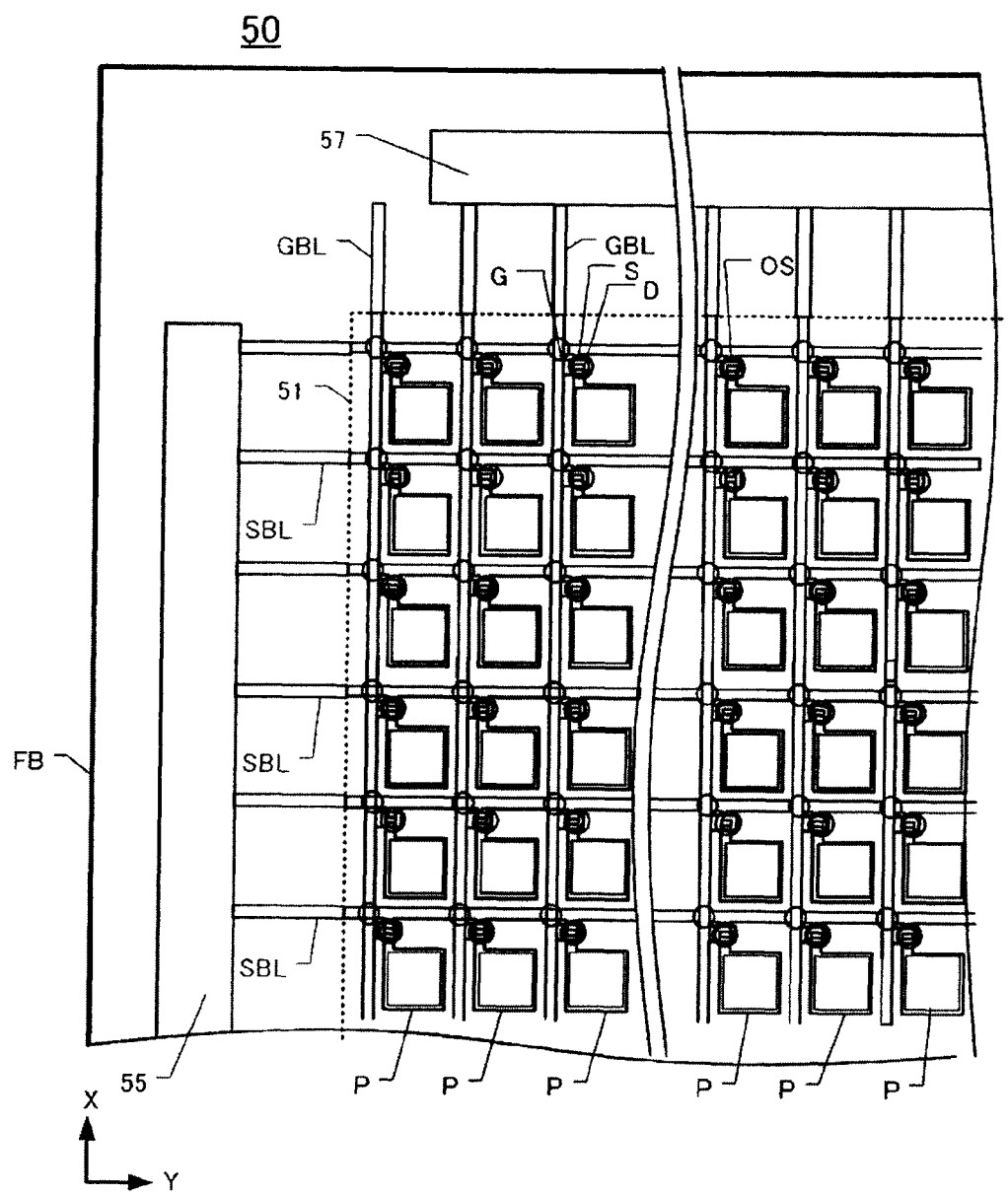
FIG. 1 is a schematic illustration view of an organic EL element that is manufactured by the organic EL element manufacturing apparatus.

FIG. 1 is a schematic illustration view of an organic EL element 50 that is manufactured by fabrication apparatus (manufacturing apparatus) 100 of an organic EL element. As shown in FIG. 1, a display region 51 of the organic EL element 50 is arranged at a sheet substrate FB, and a signal line drive circuit 55 and a scan drive circuit 57 are provided on the outer peripheral part of the display region 51. A source bus line SBL is connected to the signal line drive circuit 55, and the source bus line SBL is wired to each organic EL element 50. Also, a gate bus line GBL is connected to the scan drive circuit 57, and that gate bus line GBL is wired to each organic EL element 50. Also, a common electrode not illustrated is also wired to the organic EL element 50.

The display region 51 of the organic EL element 50 has a plurality of pixel electrodes P that respectively emit R (red), G (green), and B (blue) light. This pixel electrode P is switched by a thin film transistor. The thin film transistor has a gate electrode G, a source electrode S and a drain electrode D. An organic semiconductor layer OS (refer to FIG. 2A and FIG. 2B) is formed between the source electrode S and the drain electrode D.

Figure 2A:
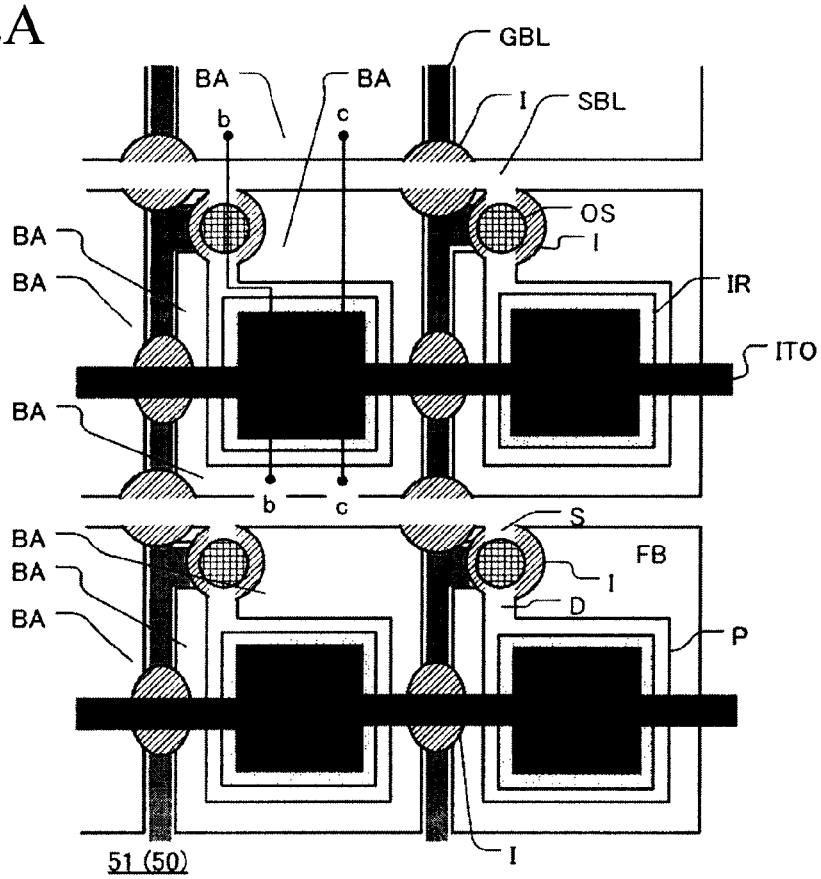
FIG. 2A is an enlarged top view of the display region of the organic EL element.
Figure 2B:
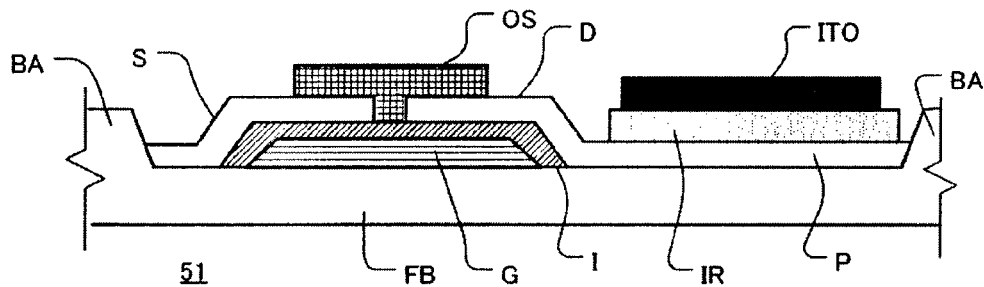
FIG. 2B is a cross-sectional view taken along line b-b in FIG. 2A.
Figure 2C:
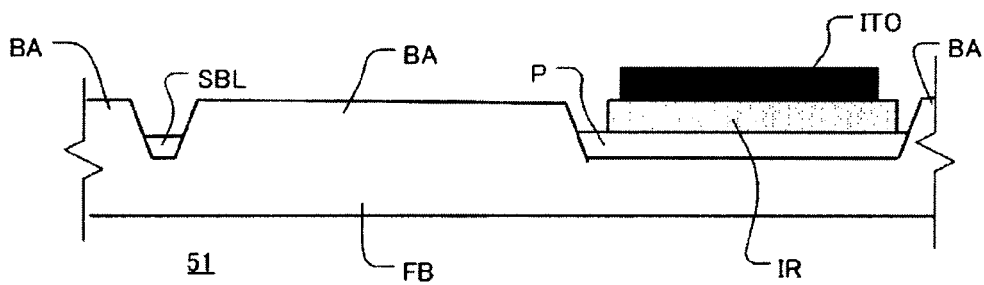
FIG. 2C is a cross-sectional view taken along line c-c in FIG. 2A.

FIG. 2A is an enlarged top view of the display region 51 of the organic EL element 50, and FIG. 2B and FIG. 2C are cross-sectional views taken along lines b-b and c-c, respectively, in FIG. 2A. In this embodiment, the organic EL element 50 is described as a bottom contact type element, but the embodiment described below can also be applied to the top contact type element.

The gate electrode G is formed on the flexible sheet substrate FB as shown in FIG. 2B. The insulating layer I is formed on the gate electrode G. The source electrode S of the source bus line SBL is formed on the insulating layer I, and the drain electrode D connected to the pixel electrode P is also formed on the insulating layer I. The organic semiconductor layer OS is formed between the source electrode S and the drain electrode D. In this way, a field effect transistor is completed. Further, as shown in FIG. 2B and FIG. 2C, a light emitting layer IR is formed on the pixel electrode P, and a transparent electrode ITO is formed on the light emitting layer IR.

As can be understood from FIG. 2B and FIG. 2C, first partition walls BA (bank) are formed in the sheet substrate FB. As shown in FIG. 2C, the source bus line SBL is formed between the first partition walls BA. As described above, due to the presence of the first partition wall BA, the source bus line SBL is formed with high precision, and also the pixel electrode P and the light emitting layer IR are formed accurately. Although not illustrated in FIG. 2B and FIG. 2C, a gate bus line GBL is formed between the first partition walls BA similarly to the source bus line SBL. A fabrication apparatus (a manufacturing apparatus) for manufacturing such an organic EL element 50 by mass production shall be described below.

<<Fabrication Apparatus of Organic EL Element>>

In order to fabricate the organic EL element 50, the fabrication apparatus 100 of the organic EL element forms the first partition wall BA at a transportation roller RR, and wiring electrodes such as the gate bus line GBL, the source bus line SBL, and the pixel electrode P are formed with high precision at the transportation roller RR by a droplet applicator. The fabrication apparatus 100 of the organic EL element that manufactures this kind of organic EL element 50 by mass production shall be described below.

Figure 3:
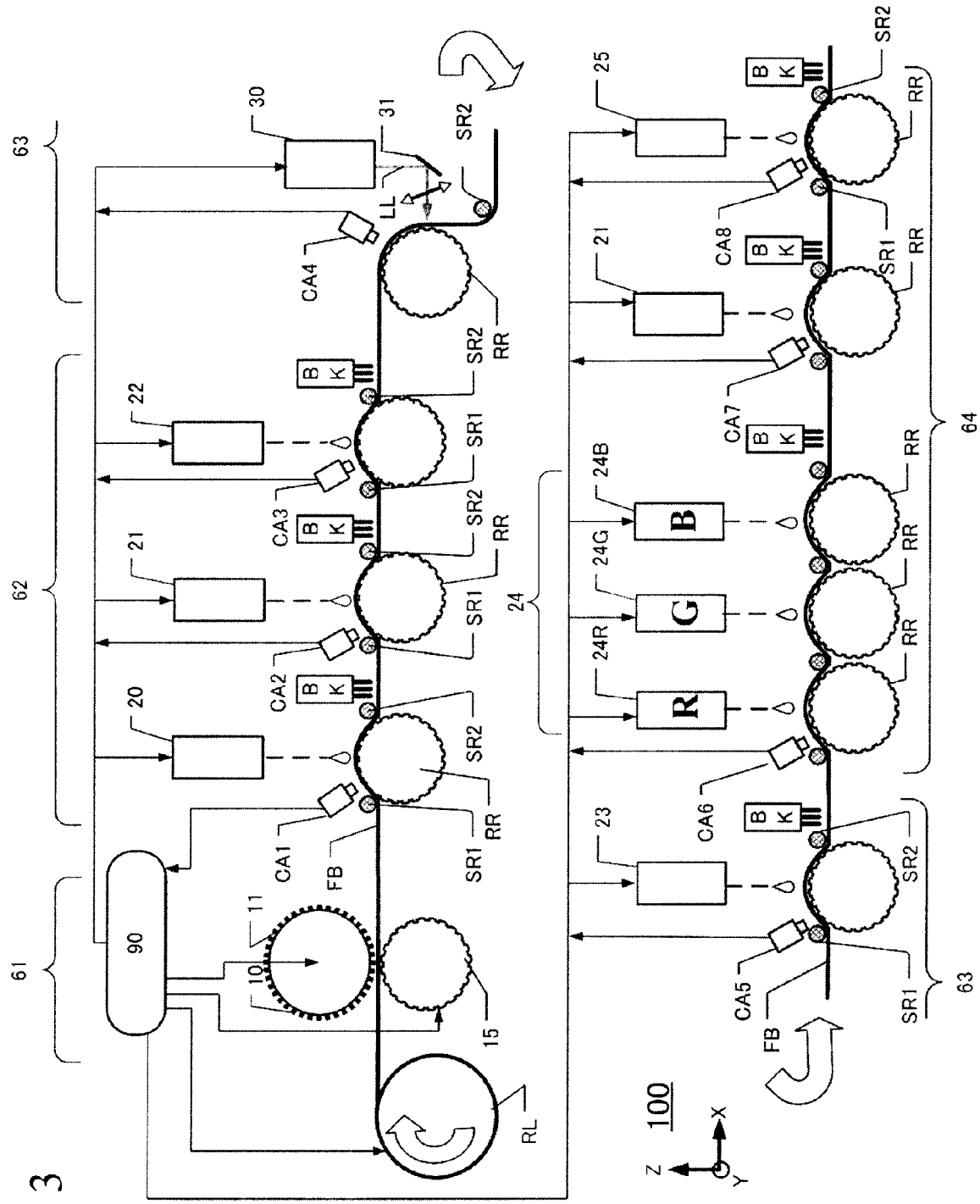
FIG. 3 is a schematic illustration view showing the constitution of the manufacturing apparatus of organic EL element.

FIG. 3 is a schematic illustration view showing the constitution of the fabrication apparatus of organic EL element that manufactures the organic EL element 50 that has the pixel electrodes P and the light emitting layer IR in the flexible sheet substrate FB. Note that the fabrication apparatus, which is continuous, is drawn divided into upper and lower stages due to space considerations.

The fabrication apparatus 100 of the organic EL element is equipped with a supply roll RL for feeding the flexible sheet substrate FB that is rolled into a roll shape. The size of the sheet substrate FB is for example 200 m long and 2 m wide. The supply roll RL rotates at a predetermined speed to feed the sheet substrate FB in an X-axial direction, which is the transportation direction. Further, the fabrication apparatus 100 of the organic EL elements is equipped with transportation rollers RR that have projections at a plurality of points, and the transportation rollers RR also rotate to feed the sheet substrate FB in the X-axial direction.

The sheet substrate FB is processed by passing through a partition wall formation process 61, an electrode formation process 62, a wiring electrode processing process 63, and a light emitting layer formation process 64, and the organic EL element 50 is completed. Hereinbelow, these processes shall be described in sequence.

<Partition Wall Formation Process 61>

The sheet substrate FB that is fed from the supply roll RL first comes to the partition wall formation process 61 that forms the first partition wall BA on the sheet substrate FB. In the partition wall formation process 61, an imprint roller 10 and a transfer roller 15 are provided in an opposing manner. The roller surface of the imprint roller 10 is mirror-finished, and a mold 11 for fine imprinting constituted of a material such as SiC or Ta is attached to the roller surface. The mold 11 for fine imprinting forms a concavo-convex (non-planar) pattern CC (refer to FIG. 5) for an alignment mark AM, wiring of a thin film transistor, and a pixel electrode. A concavo-convex (non-planar) pattern DD (refer to FIG. 6) for forming a second partition wall BB (refer to FIG. 4B) is formed on a portion of the transfer roller 15.

Figure 4A:
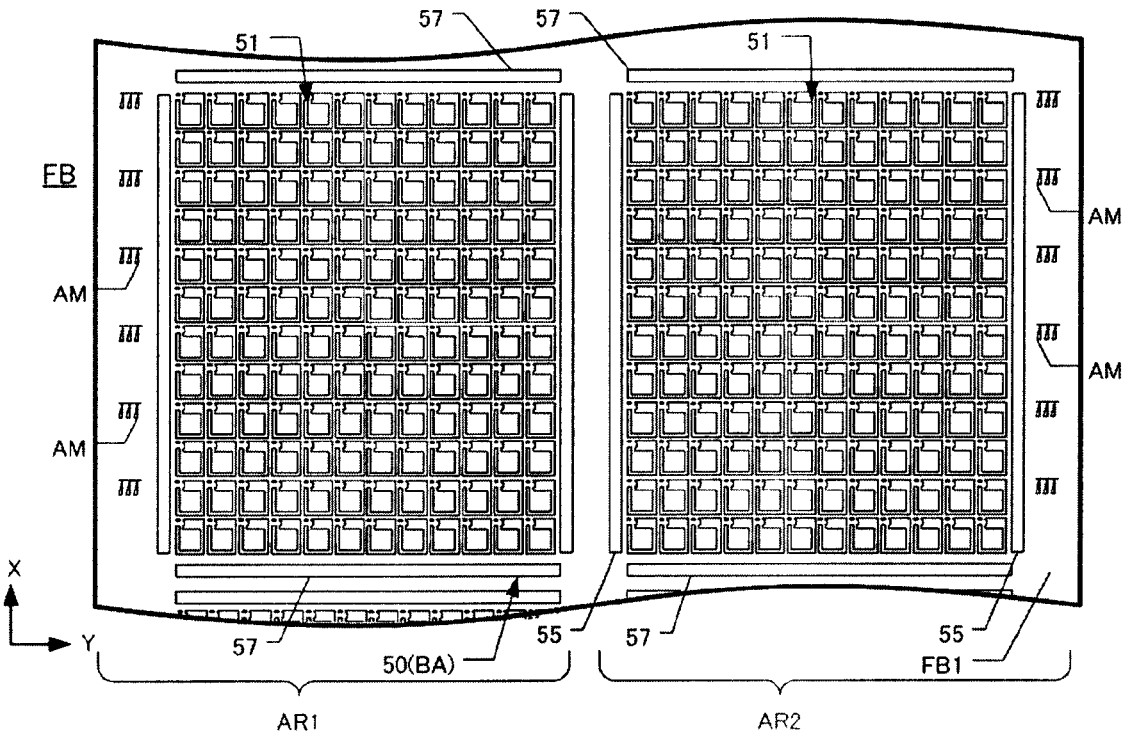
FIG. 4A is a view showing the first surface of the sheet substrate on which the first partition walls are formed by the imprint roller.

In the partition wall formation process 61, a first surface of the sheet substrate FB is pressed by the imprint roller 10 to form the first partition wall BA for wiring of a thin film transistor and a pixel electrode, and to form the alignment mark AM in both sides in the Y-axial direction that is the width direction of the sheet substrate FB (refer to FIG. 4A). Also, in the partition wall formation process 61, a second partition wall BB (refer to FIG. 4B) is formed by pressing the second surface of the sheet substrate FB by the transfer roller 15. The imprint roller 10 or the transfer roller 15 heats the sheet substrate FB to a glass transition temperature so that the first partition wall BA and the second partition wall BB that are formed by being pressed once undergo plastic deformation and retain their shape.

The fabrication apparatus 100 of organic EL element has a main control section 90, and the main control section 90 is connected with the drive portion of the supply roll RL to control the rotation of the supply roll RL. Also, the main control section 90 is connected with the drive portion of the imprint roller 10 or the transfer roller 15, and controls the rotation of the imprint roller 10 or the transfer roller 15, and controls the formation of the first partition wall BA and the second partition wall BB and the transportation of the sheet substrate FB. Note that in FIG. 3, the transportation roller RR is not connected with the main control section 90, but the main control section 90 may control the transportation of the sheet substrate FB by feed forward control or feed back control of rotation of the transportation roller RR.

<Electrode Formation Process 62>

When the sheet substrate FB is moved further in the X-axial direction it comes to the electrode formation process 62. In the electrode formation process 62, a thin film transistor (TFT) is formed. In the electrode formation process 62, a droplet applicator 20 for gate electrode, a droplet applicator 21 for insulating layer, a droplet applicator 22 for source and drain electrode as well as pixel electrodes (hereinbelow referred to as the droplet applicator 22 for source and drain) are arranged. As these droplet applicators, it is possible to adopt any ink jet type or dispenser type. Also, these droplet applicators are of a system applies droplets from the Z direction perpendicularly onto the sheet substrate FB. Examples of the ink jet type include a charge control type, a pressure vibration type, an electromechanical conversion type, a thermoelectric conversion type, an electrostatic attraction type, and the like. A droplet application method is capable of properly arranging a desired amount of a material at a desired position with no wasted use of the material.

Also, the fabrication apparatus 100 of organic EL element includes alignment cameras CA1, CA2, and CA3 upstream of the droplet applicator 20 for gate electrode, the droplet applicator 21 for insulating layer, and the droplet applicator 22 for source and drain, respectively. The alignment cameras CA1 to CA3 image the alignment marks AM (refer to FIG. 4A), and based on the image result, the droplet applicator 20 for gate electrode, the droplet applicator 21 for insulating layer, and the droplet applicator 22 for source and drain apply metal ink or electrically insulating ink.

The droplet applicator 20 for gate electrode applies metal ink to the sheet substrate FB from the Z direction at a region in which the sheet substrate FB follows the outer peripheral surface of the transportation roller RR. The metal ink is dried or baked by radiation heat such as hot air or far infrared rays with a heat treater BK. The gate electrode G is formed by these treatments.

As shown in FIG. 3, when the sheet substrate FB advances in the transportation direction, and heads toward the transportation roller RR, at the region where the sheet substrate FB enters the transportation roller RR, a small front roller SR1 is provided for moderately pressing the sheet substrate FB, and at the region where the sheet substrate FB is ejected from the transportation roller RR, a small rear roller SR2 is provided. The front roller SR1 and the rear roller SR2 increase the region in which the sheet substrate FB follows the outer peripheral surface of the transportation roller RR. The small front roller SR1 is installed so as to traverse the sheet substrate FB in the width direction, while the small rear roller SR2 moderately presses the outer edges (end portions) of the sheet substrate FB to remove bending of the sheet substrate FB. Since the metal ink that the droplet applicator 20 for gate electrode has applied is not dried, the small rear roller SR2 only presses the outer edges of the sheet substrate FB. In the following processes as well, the front roller SR1 and the rear roller SR2 are suitably arranged before and after the transportation roller RR.

The droplet applicator 21 for insulating layers applies electrically insulating ink to the sheet substrate FB at a region in which the sheet substrate FB follows the outer peripheral surface of the transportation roller RR. The electrically insulating ink is dried or baked by radiation heat such as hot air or far infrared rays with the heat treater BK. The insulating layer I is formed on the gate electrode G by these treatments.

Next, the droplet applicator 22 for source and drain applies metal ink from the Z direction at a region in which the sheet substrate FB follows the outer peripheral surface of the transportation roller RR. The metal ink is dried or baked by radiation heat such as hot air or far infrared rays with the heat treater BK. Thereby, the source electrode S, the drain electrode D and the pixel electrode P are formed.

<Wiring Electrode Processing Process 63>

Next, the mutually connected source electrode S and drain electrode D are cut by a cutting apparatus 30. The cutting apparatus 30 is a laser processing apparatus or a dicing saw. Since the cutting interval between the source electrode S and the drain electrode D determines the capability of the thin film transistor, it is necessary to perform the cutting with high precision. For that reason, the processing is carried out at the region where the sheet substrate FB follows the outer peripheral surface of the transportation roller RR. In particular, since precision is required in the interval between the source electrode S and the drain electrode D, the sheet substrate FB makes contact with the roller RR at an angle of approximately 90°. The interval, or so-called channel length, of the source electrode S and the drain electrode D is cut at a width of about 3 μm to 20 μm.

Next, an organic semiconductor droplet applicator 23 applies organic semiconductor ink to the switching section between the channel length of the source electrode S and the drain electrode D subjected to the cutting process. The organic semiconductor droplet applicator 23 applies the organic semiconductor ink from the Z direction at a region in which the sheet substrate FB follows the outer peripheral surface of the transportation roller RR. The organic semiconductor ink is dried or baked by heat radiation such as hot air or far infrared rays with the heat treater BK. An organic semiconductor layer OS as shown in FIG. 2B is formed by these treatments.

The fabrication apparatus 100 of organic EL element includes alignment cameras CA4 and CA5 upstream of the cutting apparatus 30 and the organic semiconductor droplet applicator 23, respectively. The alignment cameras CA4 and CA5 image the alignment marks AM (refer to FIG. 4A), and based on the image result, cutting is performed by the cutting apparatus 30, or organic ink is applied by the organic semiconductor droplet applicator 23.

In the above-mentioned manner, a thin film transistor or the like can be formed by employing a printing technique or droplet application technique. Only the printing technique or droplet application technique by itself cannot fabricate a thin film transistor, or the like, with high precision due to bleeding or spreading of ink. However, since the first partition wall BA is formed in the partition wall formation process 61, the bleeding or spreading of ink can be prevented. Further, since the second partition wall BB is formed, since the ink is dropped in a state of the expansion or contraction of the sheet substrate FB being corrected on the outer peripheral surface of the transportation roller RR, a thin film transistor or the like is formed with high precision.

<Light Emitting Layer Formation Process 64>

The fabrication apparatus 100 of organic EL element successively carries out a process of forming the light emitting layer IR of the organic EL element on the pixel electrode P. In a light emitting layer formation process 64, the droplet applicator 24 for light emitting layers is used.

The light emitting layer IR contains a host compound and a phosphorescent compound (referred to also as a phosphorescence-emitting compound). The host compound is a compound contained in the light emitting layer IR. The phosphorescent compound is a compound in which light emission from a triplet excitation state can be observed, and emits phosphorescent emission at room temperature.

The droplet applicator 24 for light emitting layer is provided with a droplet applicator 24R for red light emitting layer, a droplet applicator 24G for green light emitting layer, and a droplet applicator 24B for blue light emitting layer. The droplet applicator 24R for red light emitting layer applies an R solution to the pixel electrode P and carries out film formation with a thickness of 100 nm in a dried state. The R solution is a solution obtained by dissolving a red dopant material and polyvinyl carbazole (PVK) as a host material in 1,2-dichloroethane.

Successively, the droplet applicator 24G for green light emitting layer applies a G solution to the pixel electrode P. The G solution is a solution obtained by dissolving PVK as a host material and a green dopant material in 1,2-dichloroethane.

Further, the droplet applicator 24B for blue light emitting layer applies a B solution to the pixel electrode P. The B solution is a solution obtained by dissolving PVK as a host material and a blue dopant material in 1,2-dichloroethane.

Thereafter, the light emitting layer solutions are dried and cured by radiation heat such as hot air or far infrared rays with the heat treater BK. The scope of application of the area of the light emitting layer IR is wide compared to the wiring electrode, but due to the correction of the expansion or contraction of the sheet substrate FB, the R solution, the G solution and the B solution are applied at a region in which the sheet substrate FB follows the outer peripheral surface of the transportation roller RR.

Next, the droplet applicator 21 for insulating layer applies electrically insulating ink containing a polyimide-based resin or a urethane-based resin to a portion of the gate bus line GBL or the source bus line SBL in a state of the sheet substrate FB following the outer peripheral surface of the transportation roller RR. Then, the electrically insulating ink is dried and cured by radiation heat such as hot air or far infrared rays with the heat treater BK. The gate insulating layer I is formed in this way.

Thereafter, a droplet applicator 25 for transparent electrode forms a transparent electrode layer ITO by applying ITO (indium tin oxide) ink on the red-, green-, and blue-emitting layers. The ITO ink is a compound obtained by adding tin oxide ($SnO_2$) in several % to indium oxide ($In_2O_3$), and the electrode is transparent. Further, amorphous materials such as IDIXO ($In_2O_3$—ZnO) may be used for forming the transparent electrode layer ITO. The transparent electrode layer ITO preferably has a light transmittance of 90% or higher. Thereafter, the ITO ink is dried and cured by radiation heat such as hot air or far infrared rays with the heat treater BK. As for the shape of the transparent electrode layer ITO, it is formed on the upper portion of the light emitting layer IR as shown in FIG. 2B and FIG. 2C, and since there is a need to simultaneously also form a wiring electrode that connects the transparent electrode layer ITO and the transparent electrode layer ITO, it is preferable to perform the droplet application with high precision. For this reason, in the present embodiment, the ITO ink is applied from the Z direction at a region in which the sheet substrate FB follows the outer peripheral surface of the transportation roller RR.

For the droplet applicator 24 for light emitting layer and the droplet applicator 25 for transparent electrode used in the light emitting layer formation process 64, it is possible to adopt any ink jet type or dispenser type.

The fabrication apparatus 100 of organic EL element includes alignment cameras CA6, CA7, and CA8 upstream of the droplet applicator 24 for light emitting layer, the droplet applicator 21 for insulating layer, and the droplet applicator 25 for transparent electrode, respectively. The alignment cameras CA6 to CA8 image the alignment marks AM (refer to FIG. 4A), and based on the image result, apply ink.

The fabrication apparatus 100 for organic EL element described with reference to FIG. 3 can fabricate the organic EL element 50 shown in FIG. 1 and FIGS. 2A to 2C, but a hole transportation layer and an electron transportation layer can further be formed in the organic EL element in some cases. These layers also employ the printing technique and droplet application technique, and processes for forming them can be added to the fabrication apparatus 100 of organic EL element.

<Sheet Substrate FB that has Passed Through Partition Wall Formation Process 61>

Figure 4B:
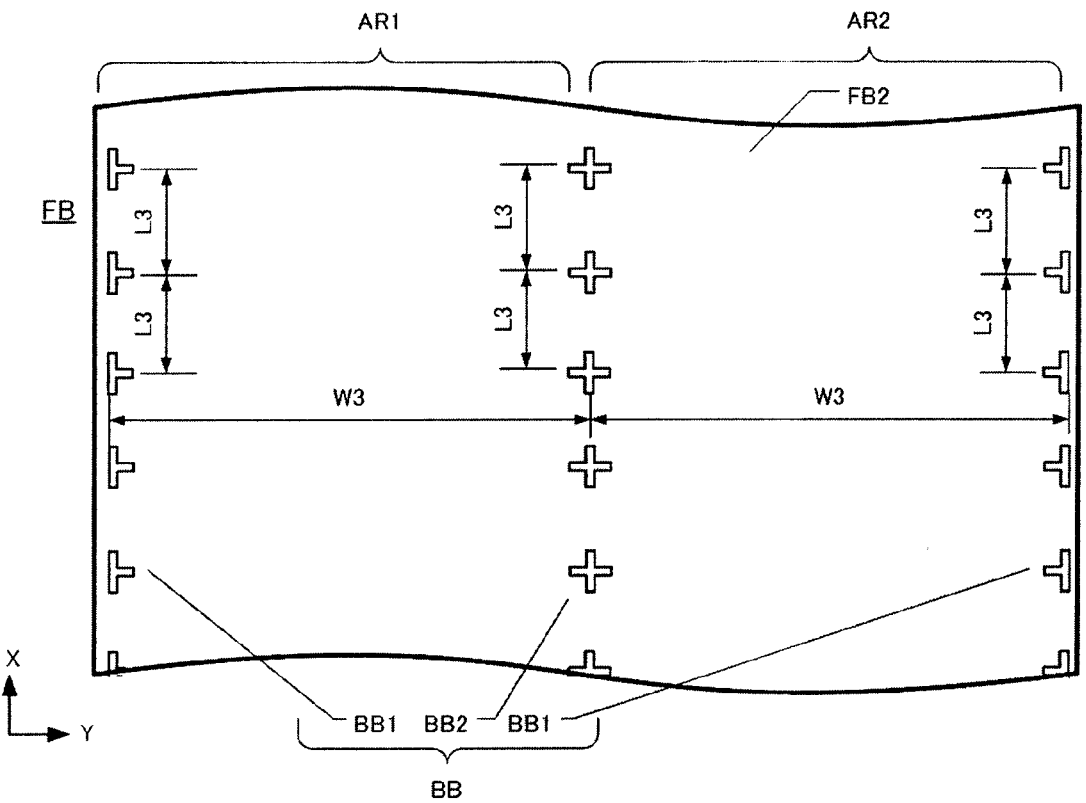
FIG. 4B is a view showing the second surface of the sheet substrate on which the second partition walls (peripheral second partition wall and a central second partition wall) are formed by the transfer roller.

FIG. 4A is a view that shows the first surface FB1 of the sheet substrate FB in which the first partition wall BA is formed by the imprint roller 10 in the partition wall formation process 61. FIG. 4B is a view that shows the second surface FB2 of the sheet substrate FB in which the second partition wall BB is formed by the transfer roller 15.

In the first surface FB1 of the sheet substrate FB shown in FIG. 4A, two rows of the first partition wall BA of the organic EL element 50 are formed side by side in the Y-axial direction that is the width direction. That is, the display region 51 is arranged in two rows in the width direction, and the signal line drive circuit 55 is disposed on both sides in the width direction. In the first surface FB1 of the sheet substrate FB, the alignment marks AM are formed at a predetermined interval on both sides in the Y-axial direction. The scan drive circuit 57 is formed on both sides in the X-axial direction of the display region 51.

Figure 5:
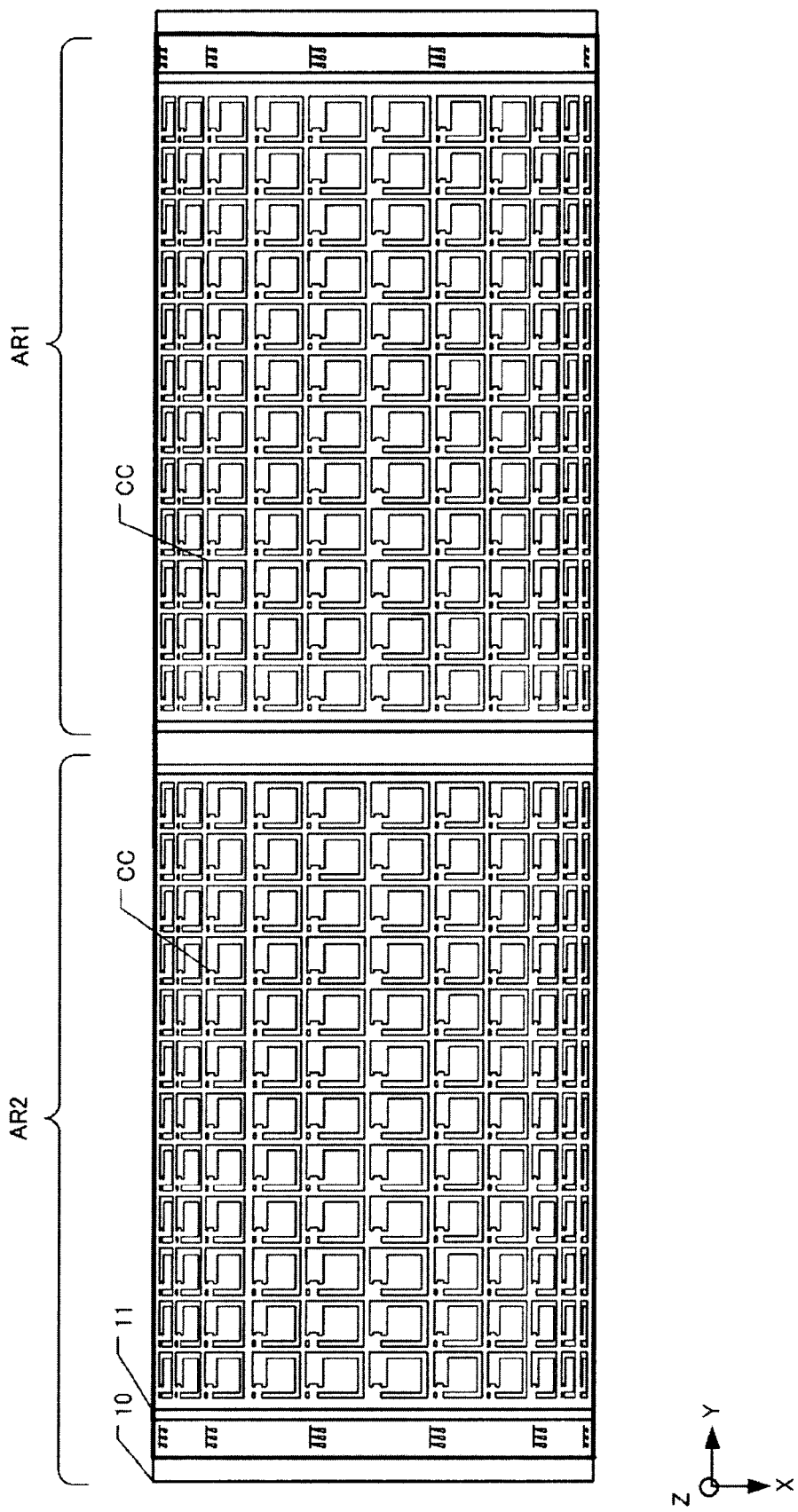
FIG. 5 is a view showing the fine imprint mold that forms the first partition wall.

FIG. 5 is a view that shows the mold 11 for fine imprinting that forms the first partition wall BA that is shown in FIG. 4A. A concavo-convex (asperity; concavity and convexity) pattern CC for wiring of the thin film transistor and for the pixel electrode is formed in the mold 11 for fine imprinting. Since the first partition wall BA that is formed in the sheet substrate FB is formed inverted, the concavo-convex pattern CC of the mold 11 for fine imprinting that corresponds to the first partition wall BA is sunken.

The second partition wall BB (a peripheral second partition wall BB1 and a central second partition wall BB2 of the second partition wall BB) are formed in the second surface FB2 of the sheet substrate FB shown in FIG. 4B. The peripheral second partition wall BB1 of the second partition wall BB are formed side by side in the transportation direction on both sides in the width direction of the sheet substrate FB. Each peripheral second partition wall BB1 consists of a trench that extends in the X-axial direction and a trench that extends in the Y-axial direction. In order to maintain the strength of both ends of the sheet substrate FB, the peripheral second partition wall BB1 is formed in a T shape in which the trench in the Y-axial direction stops at the position of intersecting the trench in the X-axial direction. The central second partition wall BB2 that is formed in the center of the sheet substrate FB in the width direction is a cross shape in which a trench that extends in the X-axial direction and a trench that extends in the Y-axial direction intersect.

For example, the cross-shaped trench and the T-shaped trench in the Y-axial direction are formed separated by distance W3. Also, in the X-axial direction the T-shaped trench and the T-shaped trench are formed separated by distance L3, and the cross-shaped trench and the cross-shaped trench are formed separated by the distance L3. Thereby, it is possible to form the second partition wall BB having the dimensions of W3×L3.

It is preferable that the trench of the second partition wall BB that is formed on the second surface FB2 is formed at a region that does not overlap with the first partition wall BA of the display region 51 that is formed on the first surface FB1. This is so as not to affect the shape or dimensions of the first partition wall BA of the display region 51.

Figure 6:
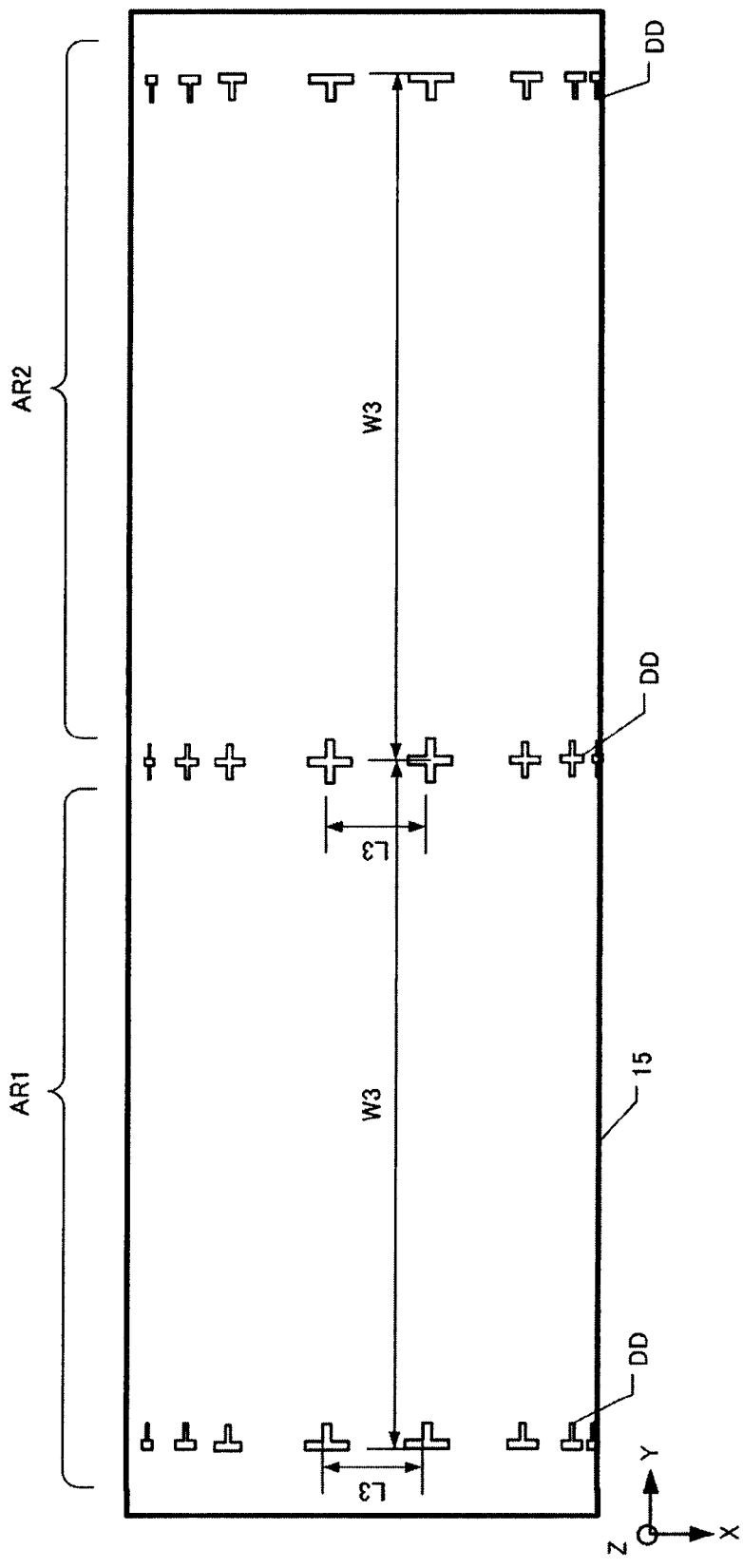
FIG. 6 is a view showing the transfer roller that forms the second partition walls (peripheral second partition wall and a central second partition wall).

FIG. 6 is a view that shows the transfer roller 15 that forms the second partition wall BB that is shown in FIG. 4B. The concavo-convex pattern DD for the second partition wall BB is formed in the transfer roller 15. Since the second partition wall BB that is formed in the sheet substrate FB is formed inverted, projections are formed for the concavo-convex pattern DD of the transfer roller 15 corresponding to the second partition wall BB.

As for the projections of the concavo-convex pattern DD of the transfer roller 15, in the Y-axial direction a cross-shaped projection and a T-shaped projection are formed separated by distance W3, so as to correspond to FIG. 4B. Also, in the X-axial direction the T-shaped projection and the T-shaped projection are formed separated by the distance L3, and the cross-shaped projection and the cross-shaped projection are formed separated by the distance L3. Also, it is preferable that the distal end of the projections of the concavo-convex pattern DD have an inverted U shape or an inverted V shape. The projections of the concavo-convex pattern DD of the transfer roller 15 have a shape that corresponds to the shape of the partition wall of the second partition wall BB.

<Sheet Substrate FB and Transportation Roller RR>

Figure 7:
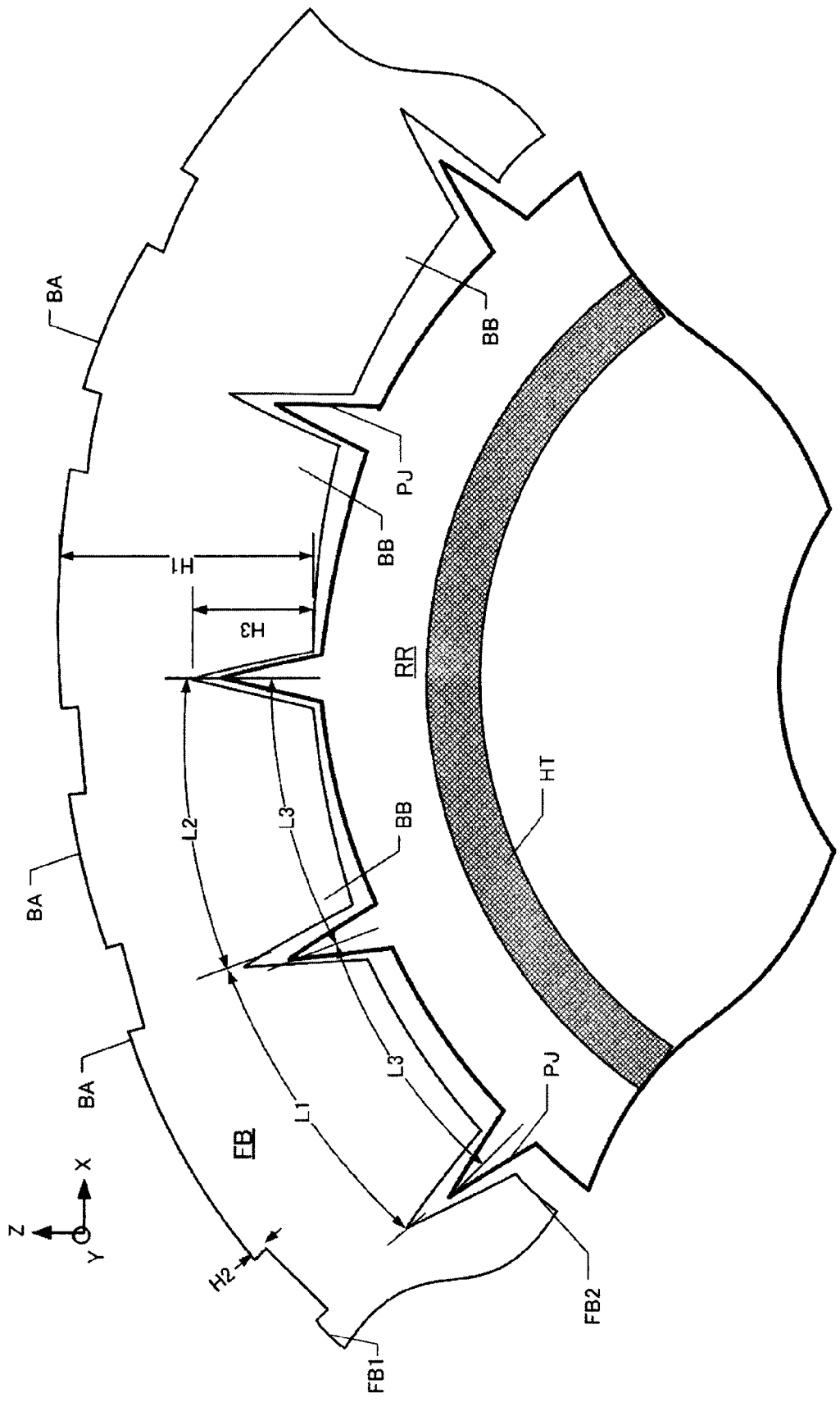
FIG. 7 is an enlarged cross-sectional view in the transportation direction that shows the state of the sheet substrate transported by the transportation roller.
Figure 8:
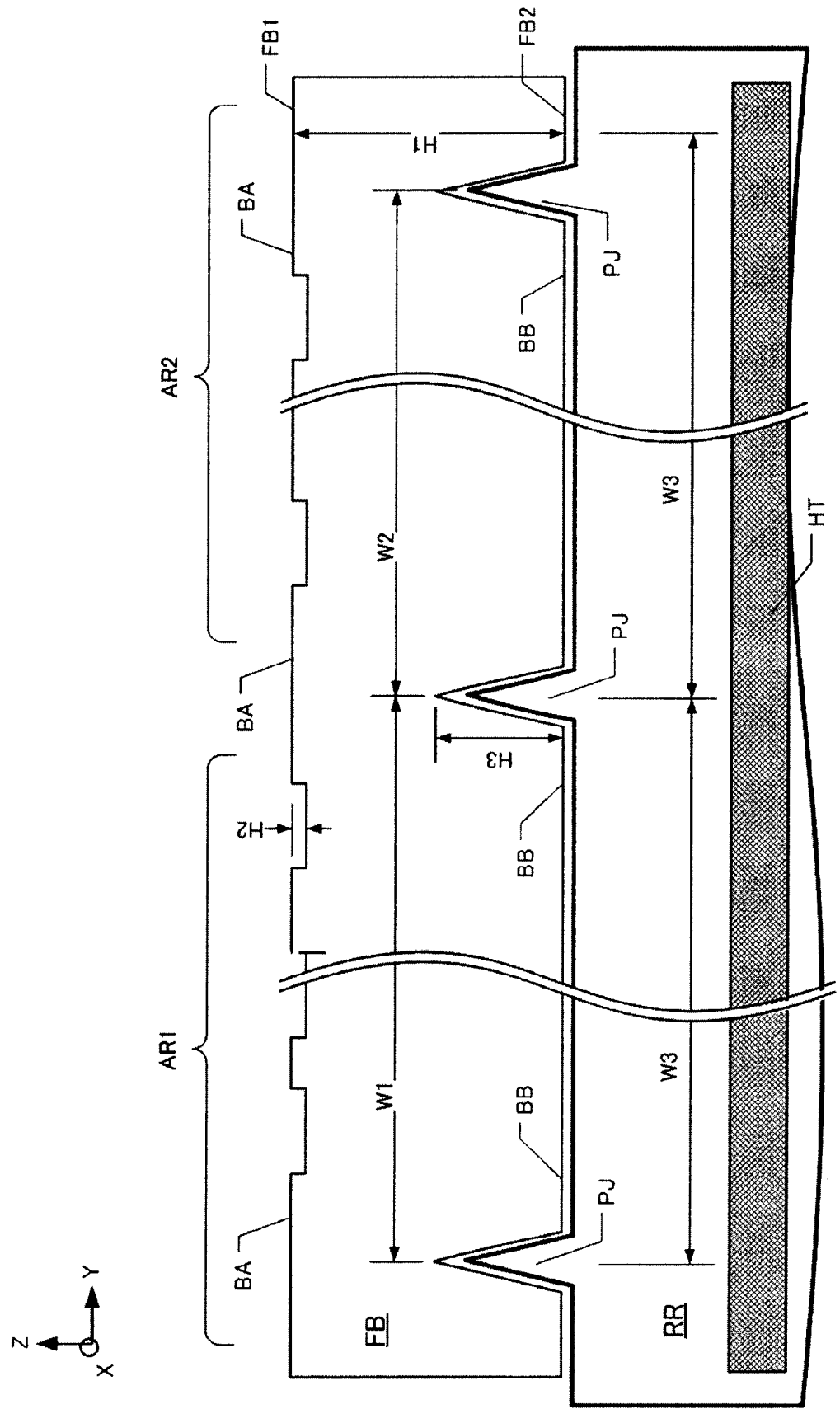
FIG. 8 is an enlarged cross-sectional view in the width direction of the sheet substrate that shows the state of the sheet substrate transported by the transportation roller.

FIG. 7 is an enlarged cross-sectional view in the transportation direction that shows the state of the sheet substrate FB transported by the transportation roller RR. FIG. 8 is an enlarged cross-sectional view in the width direction of the sheet substrate FB that shows the state of the sheet substrate FB transported by the transportation roller RR. For example, in FIG. 7 and FIG. 8, it is the transportation roller RR of the electrode formation process 62 that is shown in FIG. 3.

In FIG. 7 and FIG. 8, the sheet substrate FB has a thickness H1 of for example 100 μm, and is formed with a resin film. Specifically, polyethylene resin, polypropylene resin, polyester resin, ethylene vinyl copolymer resin, polyvinyl chloride resin, cellulose resin, polyamide resin, polyimide resin, polycarbonate resin, polystyrene resin, vinyl acetate resin, or the like is used as the sheet substrate FB.

The first partition wall BA that is formed by the mold 11 for fine imprinting (refer to FIG. 5) is formed in the first surface FB1 of the sheet substrate FB. The step of the first partition wall BA (the depth of the first partition wall BA, the height of the first partition wall BA) H2 is approximately 1 μm to 3 μm. The second partition wall BB that is formed by the transfer roller 15 (refer to FIG. 6) is formed in the second surface FB2. The step of the second partition wall BB (the depth of the second partition wall BB, the height of the second partition wall BB) H3 is approximately 10 μm to 70 μm. That is, the step H3 of the second partition wall BB is approximately 10 times or more and 60 times or less than the step H2 of the first partition wall BA, and the step H3 of the second partition wall BB is extremely larger than the step H2 of the first partition wall BA. The step H3 of the second partition wall BB serves to correct the expansion or contraction of the sheet substrate FB.

Also, the step H3 of the second partition wall BB is preferably approximately 1/10 times or more and 2/3 times or less compared to the thickness H1 of the sheet substrate FB. Moreover, the step H3 of the second partition wall BB is more preferably approximately 1/5 times or more and 2/3 times or less compared to the thickness H1 of the sheet substrate FB. This is because when the step H3 of the second partition wall BB is ⅔ times or more the thickness H1 of the sheet substrate FB, the vicinity of the second partition wall BB becomes weak. On the other hand, when the step H3 of the second partition wall BB is not ¹⁄₁₀ times or more the thickness H1 of the sheet substrate FB, it is difficult to correct the expansion or contraction of the sheet substrate FB.

A projection PJ is formed on the outer periphery of the transportation roller RR. The shape of this projection PJ is a shape that just fits into the trench of the second partition wall BB that is shown in FIG. 4B. The outer peripheral surface of the transportation roller RR is the same shape as the outer peripheral surface of the transfer roller 15 shown in FIG. 6. That is, the peripheral T-shaped projections PJ are formed side by side in the transportation direction on both sides of the axial direction of the transportation roller RR. Also, the central cross-shaped projections PJ are formed side by side in the transportation direction in the center of the axial direction of the transportation roller RR. The cross-shaped projection and the T-shape projection are formed separated by distance W3 in the Y-axial direction of the transportation roller RR. Also, in the X-axial direction the T-shaped projection and the T-shaped projection are formed separated by the distance L3, and the cross-shaped projection and the cross-shaped projection are formed separated by the distance L3.

Note that it is preferable for the projection PJ of the transportation roller RR to be slightly smaller dimensionally than the projection of the concavo-convex pattern DD of the transfer roller 15. Even if some positional shifting occurs, it is possible for the projection PJ to engage with the trench of the second partition wall BB. Also, the projection PJ of the transportation roller RR may be a size that enables correction of the expansion or contraction of the sheet substrate FB. Note that the shape of the projection of the concavo-convex pattern DD of the transfer roller 15 and the projection PJ of the transportation roller RR are drawn with a pyramidal shape, that is, an inverted V shape, but may also be an inverted U shape.

The sheet substrate FB has a size of for example a roll length of 200 m and a width of 2 m. When the sheet substrate FB is conveyed, appropriate tension is applied to the sheet substrate FB so that wrinkles do not form in the sheet substrate FB. However, when the sheet substrate FB is manufactured, the thickness H1 may partially differ by 1 to 2 percent. For example, in FIG. 8, the thickness of the region AR1 is 100 μm, and the thickness of the region AR2 is sometimes 102 μm. Then, when tension is applied to the sheet substrate FB, a difference in expansion or contraction in the sheet substrate FB ranging from several hundred μm to several mm occurs in the X-axial direction or the Y-axial direction in the region AR1 and the region AR2. Also, as a result of passing through the plurality of processing processes as shown in FIG. 3, the sheet substrate FB sometimes expands or contracts.

As shown in FIG. 7, in the sheet substrate FB that is sent from the transportation roller RR, the space between the T-shaped second partition wall BB and the T-shaped second partition wall BB in the X-axial direction expands or contracts to distance L1 or distance L2. That is, it may become a distance that differs with the point in time when formed in the sheet substrate FB in the partition wall formation process 61.

Since the projection PJ and the projection PJ of the transportation roller RR in the X-axial direction is distance L3, even if the space in the sheet substrate FB between the second partition wall BB and the second partition wall BB is distance L1 or distance L2, when engaged together, the space in the sheet substrate FB between the second partition wall BB and the second partition wall BB is corrected to the distance L3. That is, by the projections PJ of the transportation roller RR substantively being fit into the two adjacent trenches in the X-axial direction of the second partition wall BB, the pitch between the trenches in the X-axial direction of the second partition wall BB is partially corrected to become the distance L3 in accordance with the pitch of the projections PJ of the transportation roller RR in the X-axial direction. Since the step H3 of the second partition wall BB is approximately ¹⁄₁₀ times or more the thickness H1 of the sheet substrate FB, not just the distance of the second surface FB2 of the sheet substrate FB but also the distance of the first surface FB1 is corrected. In order to also correct the distance of the first surface FB1 of the sheet substrate FB, it is preferable for the step H3 of the second partition wall BB to be approximately ½ times or more the thickness H1 of the sheet substrate FB.

Similarly, as shown in FIG. 8, in the sheet substrate FB that is sent from the transportation roller RR, the space between the T-shaped second partition wall BB and the cross-shaped second partition wall BB in the Y-axial direction sometimes expands or contracts from the distance W3 that is formed in the partition wall formation process 61 to the distance W1 or the distance W2.

Since the projection PJ and the projection PJ of the transportation roller RR in the Y-axial direction is distance W3, even if the space in the sheet substrate FB between the second partition wall BB and the second partition wall BB is distance W1 or distance W2, when engaged together, the space in the sheet substrate FB between the second partition wall BB and the second partition wall BB is corrected to the distance W3. That is, by the projections PJ of the transportation roller RR substantively fitting into the two adjacent trenches in the Y-axial direction of the second partition wall BB, the pitch between the trenches in the Y-axial direction of the second partition wall BB is partially corrected to become the distance W3 in accordance with the pitch of the projections PJ of the transportation roller RR in the Y-axial direction. Since the step H3 of the second partition wall BB is approximately ¹⁄₁₀ times or more the thickness H1 of the sheet substrate FB, the distance of the first surface FB1 of the sheet substrate FB is also corrected.

Although not illustrated in FIG. 7 and FIG. 8, the droplet applicator 20 to the droplet applicator 25 or the cutting apparatus 30 shown in FIG. 3 are disposed above the transportation roller RR (Z-axial direction). Since it is possible to apply the metal ink or the like and perform cutting by laser radiation in the state of the expansion or contraction of the sheet substrate FB being corrected, accurate application or cutting becomes possible.

Also, the alignment camera CA1 to the alignment camera CA8 image the alignment marks in the region in which the sheet substrate FB follows the outer peripheral surface of the transportation roller RR. Since the expansion or contraction of the sheet substrate FB is in a state of being corrected on the outer peripheral surface of the transportation roller RR, and the alignment camera CA1 to the alignment camera CA8 can detect the positions of the alignment marks AM by imaging them in this state, it is possible to perform position detection with high precision.

Note that in FIG. 7 and FIG. 8, a heater HT is built into the transportation roller RR. In the state of the sheet substrate FB engaging with the projections PJ of the transportation roller RR, it is corrected to the distance L3 and the distance W3 in the X-axial direction and the Y-axial direction. When the sheet substrate FB is heated to a glass transition temperature or higher in this state, the sheet substrate FB undergoes plastic deformation. As the sheet substrate FB separates from the transportation roller RR as a result of the transportation roller RR rotating, it is cooled, and the sheet substrate FB becomes lower than the glass transition temperature. Then the sheet substrate FB is conveyed to the next process while maintaining the corrected state. Accordingly, it is possible to maintain the state of the expansion or contraction of the sheet substrate FB being corrected not only when it is engaged with the transportation roller RR but even in the state of the sheet substrate FB being separated from the transportation roller RR. This kind of heater HT need not be built into all the transportation rollers RR, and may be disposed downstream of locations where the expansion or contraction of the sheet substrate FB is particularly large.

Also, in the aforementioned FIG. 7 and FIG. 8, for example, sometimes the second partition wall BB of the sheet substrate FB and the projections PJ of the transportation roller RR do not engage well, or sometimes the second partition wall BB engage with only some of the projections PJ. In such cases, as the need arises, for example the metal ink of the droplet applicator 20 may be applied based on the alignment marks AM that are formed in the sheet substrate FB, or the metal ink of the droplet applicator 20 may be applied based on the projections PJ of the transportation roller RR and the alignment marks AM that are formed in the sheet substrate FB. As described above the projections PJ of the transportation roller RR were disclosed as engaging with the trenches of the second partition wall BB, but stated otherwise, the second partition wall BB is engaged between the projections PJ of the transportation roller RR. That is, the second partition wall BB and the transportation roller RR have mutually engaging shapes.

<Operation of Fabrication Apparatus of Organic EL Element>

Figure 9:
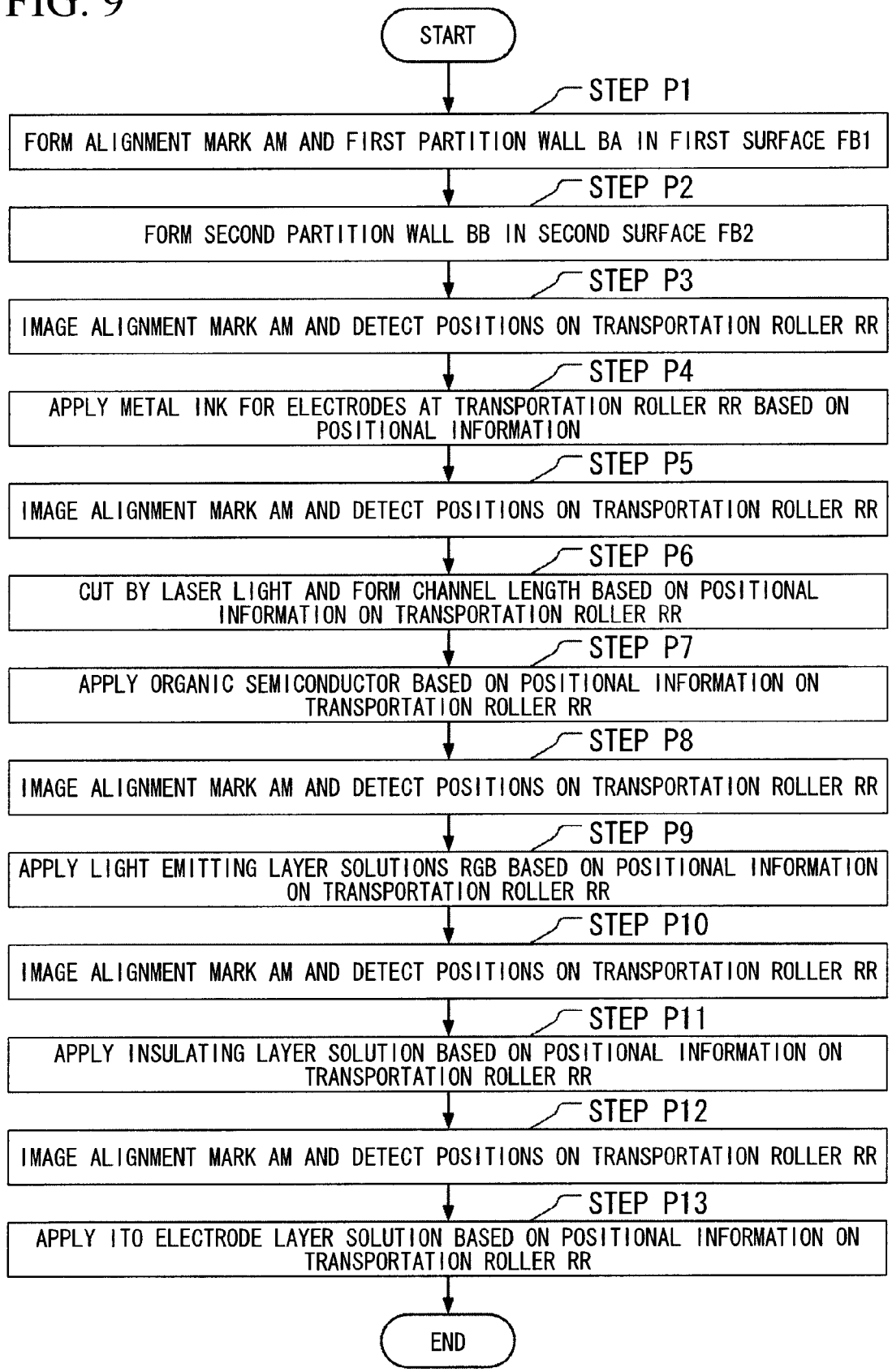
FIG. 9 is an outline flowchart that shows the operations of the organic EL element manufacturing apparatus.

FIG. 9 is a flowchart that shows the operation of the fabrication apparatus 100 of the organic EL element. Comprehension will increase if the reference numerals in FIGS. 3, 7 and 8 are referred to.

In a step P1 that is the partition wall formation process 61, the alignment marks AM and first partition walls BA for a thin film transistor and light emitting layer are formed in the first surface FB1 of the sheet substrate FB by the heat transfer by the imprint roller 10. Note that since the mutual positional relation of the alignment marks AM and first partition walls BA is important, they are formed simultaneously.

In a step P2, the second partition walls BB are formed by the heat transfer by the transfer roller 15 in the second surface FB2 of the sheet substrate FB.

The process then proceeds to the electrode formation process 62, and in a step P3, the alignment marks AM are imaged by the alignment camera CA1 to the alignment camera CA3 in the state of the projections PJ of the transportation roller RR being engaged with the second partition wall BB of the sheet substrate FB (the state of the shape of the transportation roller RR and the shape of the second partition wall BB being engaged). Then, the main control section 90 grasps (figure out) the position of the sheet substrate FB.

Next, in a step P4, based on the positional information from the main control section 90, the droplet applicator 20 for gate electrode, the droplet applicator 21 for insulating layer, and the droplet applicator 22 for source and drain in turn apply metal ink for various electrodes in the state of the projections PJ of the transportation roller RR and the second partition wall BB of the sheet substrate FB being engaged.

The process then proceeds to the wiring electrode processing process 63, and in a step P5, the alignment camera CA4 or the alignment camera CA5 image the alignment marks AM in the state of the projections PJ of the transportation roller RR and the second partition wall BB of the sheet substrate FB being engaged, and the main control section 90 grasps the position of the sheet substrate FB.

Next, in a step P6, based on the positional information from the main control section 90, the laser of the cutting apparatus 30 accurately cuts space between the source electrode S and the drain electrode D and forms the channel length in the state of the projections PJ of the transportation roller RR and the second partition wall BB of the sheet substrate FB being engaged.

Also, in a step P7, based on the positional information from the main control section 90, the organic semiconductor droplet applicator 23 applies an organic semiconductor to the space between the source electrode S and the drain electrode D in the state of the projections PJ of the transportation roller RR and the second partition wall BB of the sheet substrate FB being engaged.

In a step P8, the alignment camera CA6 images the alignment marks AM in the state of the projections PJ of the transportation roller RR and the second partition wall BB of the sheet substrate FB being engaged, and the main control section 90 grasps the position of the sheet substrate FB.

In a step P9, the droplet applicator 24 (24R, 24G 24B) for light emitting layers applies R, G, and B solutions on the pixel electrode P in the state of the projections PJ of the transportation roller RR and the second partition wall BB of the sheet substrate FB being engaged.

In a step P10, the alignment camera CA7 images the alignment marks AM in the state of the projections PJ of the transportation roller RR and the second partition wall BB of the sheet substrate FB being engaged, and the main control section 90 grasps the position of the sheet substrate FB.

Next, in a step P11, based on the positional information from the main control section 90, the droplet applicator 21 for insulating layer applies electrically insulating ink in the state of the projections PJ of the transportation roller RR and the second partition wall BB of the sheet substrate FB being engaged.

In a step P12, the alignment camera CA8 images the alignment marks AM in the state of the projections PJ of the transportation roller RR and the second partition wall BB of the sheet substrate FB being engaged, and the main control section 90 grasps the position of the sheet substrate FB.

Next, in a step P13, based on the positional information from the main control section 90, the droplet applicator 25 for transparent electrode applies ITO ink in the state of the projections PJ of the transportation roller RR and the second partition wall BB of the sheet substrate FB being engaged.

<Separate Sheet Substrate FB that has Passed Through Partition Wall Formation Process 61>

Figure 10A:
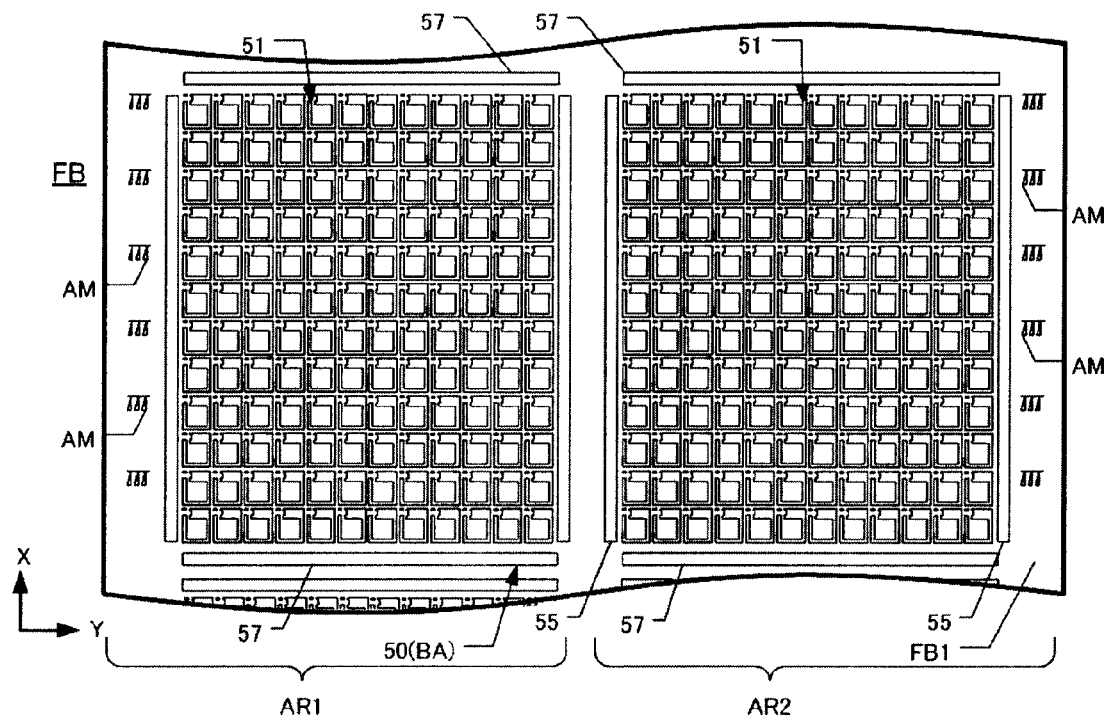
FIG. 10A is a view that shows the first surface of the sheet substrate in which the first partition walls are formed by the imprint roller.
Figure 10B:
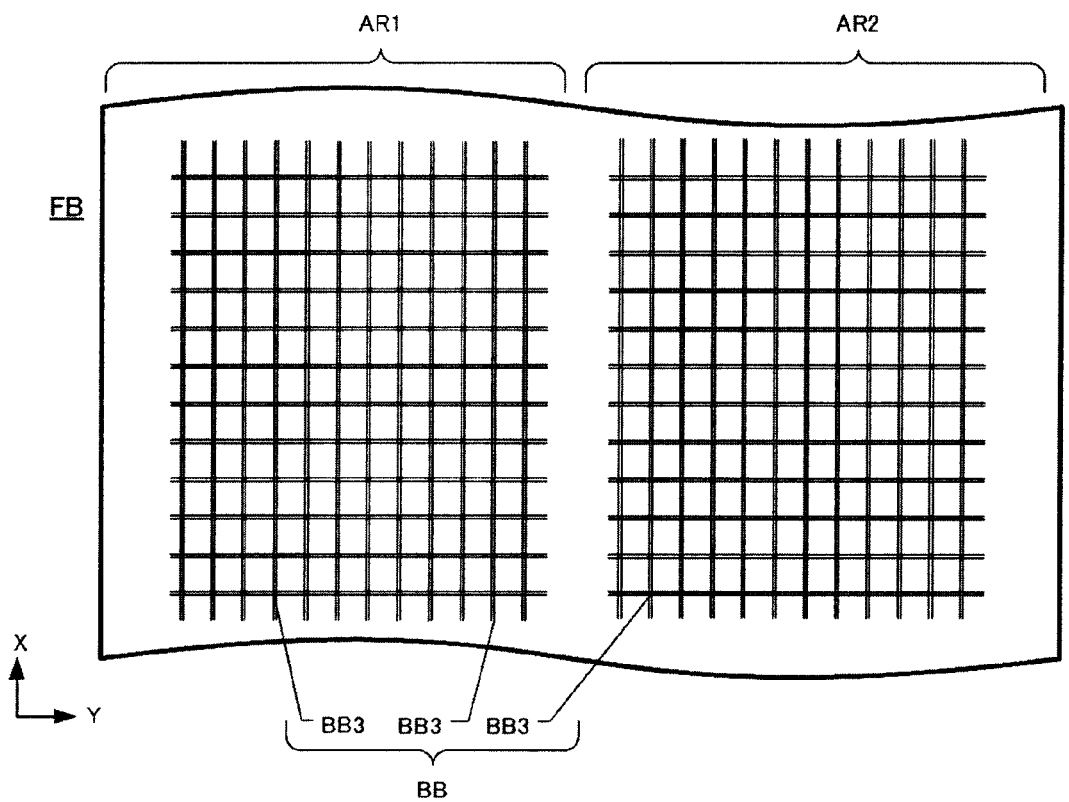
FIG. 10B is a view that shows the second surface of the sheet substrate in which the second partition walls (grid partition wall) is formed by the transfer roller.

FIG. 10A is a view that shows the first surface FB1 of the sheet substrate FB in which the first partition wall BA is formed by the imprint roller 10 in the partition wall formation process 61. FIG. 10B is a view that shows the second surface FB2 of the sheet substrate FB in which the second partition wall BB is formed by the transfer roller 15. However, unlike the second partition wall BB shown in FIG. 4B (the second partition wall BB that is formed by the peripheral second partition wall BB1 and the central second partition wall BB2), the second partition wall BB that is shown in FIG. 10B is formed by a grid partition wall BB3.

In the first surface FB1 of the sheet substrate FB shown in FIG. 10A, the display regions 51 are arranged in two rows side by side in the width direction, the signal line drive circuit 55 is disposed on both sides in the width direction, and the scan drive circuit 57 is formed on both sides in the X-axial direction of the display region 51, similarly to the first partition wall BA of the organic EL element 50 that is shown in FIG. 4A. As shown in FIG. 1, a gate bus line GBL that extends in the X-axial direction, and a source bus line SBL that extends in the Y-axial direction are formed in the display region 51.

The second partition wall BB (grid partition wall BB3) is formed in the second surface FB2 of the sheet substrate FB that is shown in FIG. 10B. The grid partition wall BB3 consists of a trench having approximately the same shape and dimensions as the gate bus line GBL that extends in the X-axial direction and the source bus line SBL that extends in the Y-axial direction of the display region 51.

The trench of the second partition wall BB that is formed in the second surface FB2 is formed in a region that overlaps with the gate bus line GBL and the source bus line SBL of the display region 51 that is formed in the first surface FB1. By the trench of the second partition wall BB overlapping with the gate bus line GBL and the source bus line SBL, there is no effect on the channel length that is the interval between the source electrode S and the drain electrode D, of which the channel length of the display region 51 requires strict dimensions.

Figure 11:
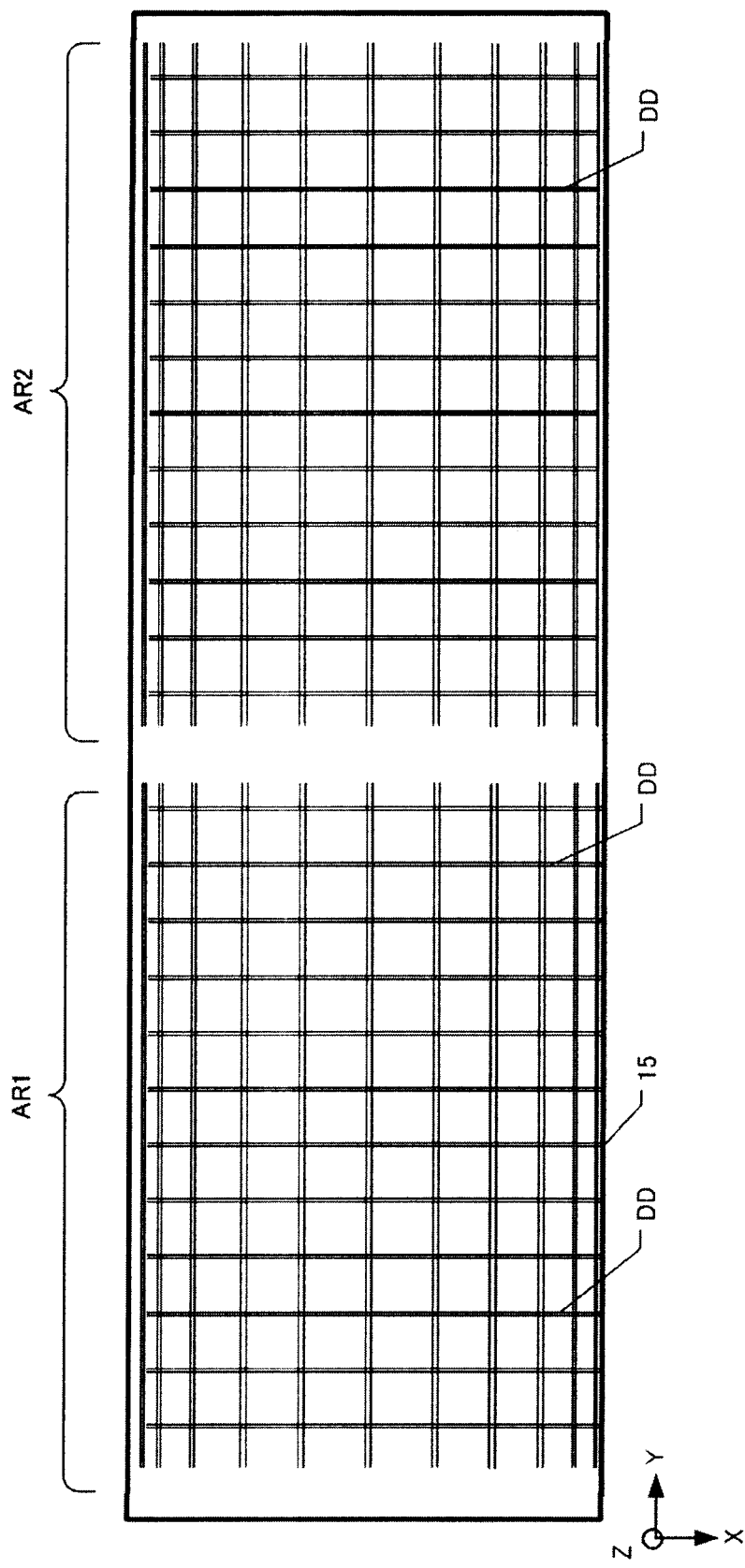
FIG. 11 is a view that shows the transfer roller that forms the second partition walls (grid partition wall).

FIG. 11 is a view showing the transfer roller 15 that forms the second partition wall BB shown in FIG. 10B. The concavo-convex pattern DD for forming the second partition wall BB is formed in the transfer roller 15. Since the second partition wall BB that is formed in the sheet substrate FB is formed inverted, projections are formed for the concavo-convex pattern DD of the transfer roller 15 corresponding to the second partition wall BB.

The projections of the concavo-convex pattern DD of the transfer roller 15 are formed in a grid shape in the X-axial direction and the Y-axial direction so as to correspond to FIG. 10B. Also, it is preferable that the distal end of the projections of the concavo-convex pattern DD have an inverted U shape or an inverted V shape.

The grid partition wall BB3 of the second partition wall BB that is shown in FIG. 10B is formed more densely in the second surface FB2 of the sheet substrate FB than the peripheral second partition wall BB1 and the central second partition wall BB2 of the second partition wall BB that is shown in FIG. 4B. Moreover, since the grid partition wall BB3 overlaps with the gate bus line GBL and the source bus line SBL, it is possible to accurately correct expansion or contraction of the sheet substrate FB. The step H3 of the second partition wall BB (depth or height of the second partition wall BB; in other words, the depth or height of the grid partition wall BB3) that is formed by the grid partition wall BB3 by being transferred by the transfer roller 15 (refer to FIG. 11) is approximately 10 μm to 50 μm. It is approximately 1/10 times or more and 1/2 times or less compared to the thickness H1 of the sheet substrate FB, and preferably 1/5 times or more and 1/2 times or less. Since the grid partition wall BB3 is formed densely, the step H3 of the second partition wall (grid partition wall BB3) that is formed by the grid partition wall BB3 may be shallower than the step H3 of the second partition wall BB (the peripheral second partition wall BB1 and the central second partition wall BB2) that is shown in FIG. 4B.

<Modification of Partition Wall Formation Process 61>

Figure 12A:
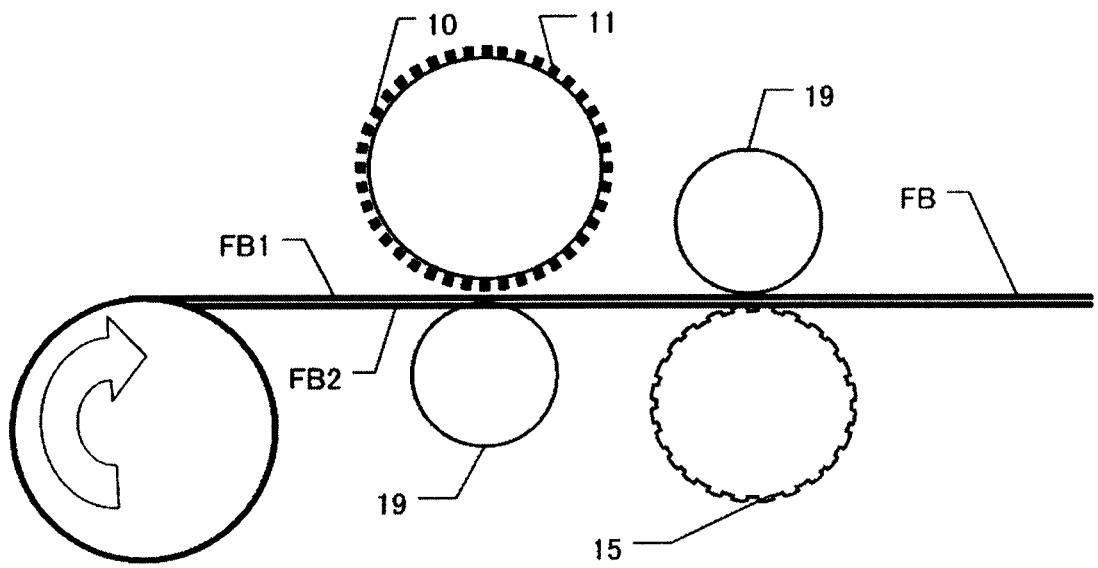
FIG. 12A shows an example of the imprint roller and the transfer roller being disposed in the transportation direction respectively.
Figure 12B:
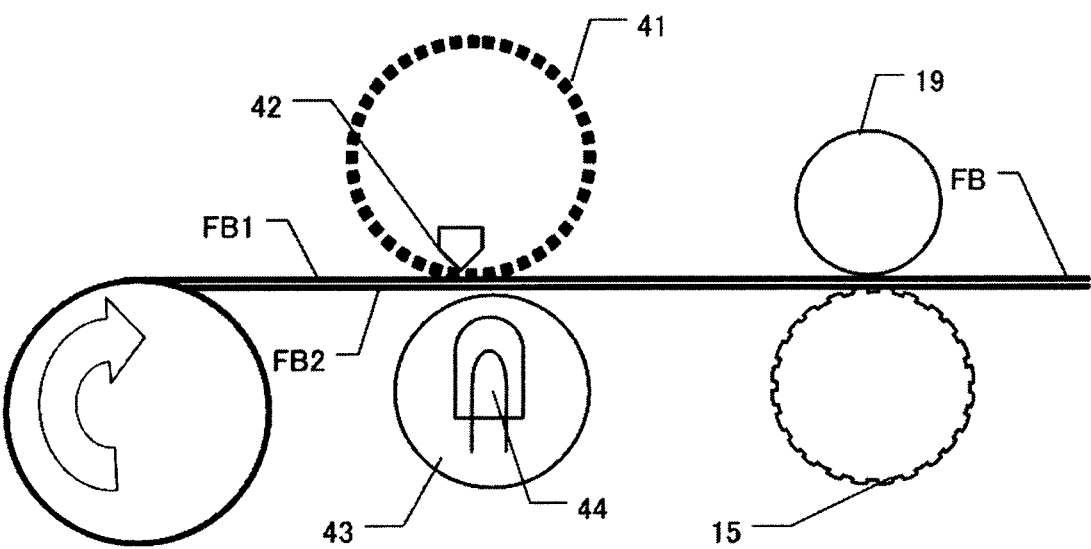
FIG. 12B shows an example of the ultraviolet curing imprint roller and the transfer roller being disposed in the transportation direction respectively.

FIGS. 12A and 12B are views that show modifications of the partition wall formation process 61 shown in FIG. 3. FIG. 12A is an example of the imprint roller 10 and the transfer roller 15 being separately disposed in the transportation direction. FIG. 12B is an example of an ultraviolet curing imprint roller 41 and the transfer roller 15 being separately disposed in the transportation direction.

In FIG. 12A, a support roller 19 is arranged below opposite the imprint roller 10. The support roller 19 is a roller with the outer peripheral surface thereof formed with little surface roughness and with high dimensional accuracy, and makes contact with the second surface FB2 of the sheet substrate FB. Also, the transfer roller 15 is arranged downstream of the imprint roller 10 and in contact with the second surface FB2 of the sheet substrate FB. The support roller 19 is arranged above opposite the transfer roller 15. Even if arranged in this manner, it is possible to form the first partition wall BA and the second partition wall BB in the partition wall formation process 61. Also, the transfer roller 15 may be disposed upstream of the imprint roller 10.

In FIG. 12B, the ultraviolet curing imprint roller 41 is disposed in place of the aforementioned imprint roller 10. An ultraviolet curable liquid resin is contained in the ultraviolet curing imprint roller 41. Also, holes are formed in the ultraviolet curing imprint roller 41 where the first partition wall BA should be formed. With the transport of the sheet substrate FB, the ultraviolet curable liquid resin is pushed out from the holes of the ultraviolet curing imprint roller 41 by a squeegee 42. A transparent support roller 43 is arranged below opposite the ultraviolet curing imprint roller 41. The outer periphery of the transparent support roller 43 is formed with a material that passes ultraviolet light, such as glass. Also, the surface thereof is formed with little surface roughness.

Light including ultraviolet light is radiated on the liquid resin that is pushed out by an ultraviolet light radiating portion 44 that is disposed in the transparent support roller 43. The liquid resin is cured and the first partition wall BA is formed.

Examples of the ultraviolet curable liquid resin include aliphatic allyl urethane, a nonvolatile material, aromatic acid methacrylate, aromatic acrylic acid ester, acrylated polyester oligomer, acrylate monomer, polyethylene glycol dimethacrylate, laurylmethacrylate, aliphatic diacrylate, trifunctional acid ester, and epoxy resin. These molecular masses are in a range of a weight average molecular weight of 100 to 10,000.

The transfer roller 15 is disposed downstream of the ultraviolet curing imprint roller 41 and in contact with the second surface FB2 of the sheet substrate FB. The support roller 19 is arranged above opposite the transfer roller 15. The transfer roller 15 may also be arranged upstream of the ultraviolet curing imprint roller 41.

<Modification of Transportation Roller RR>

Figure 13:
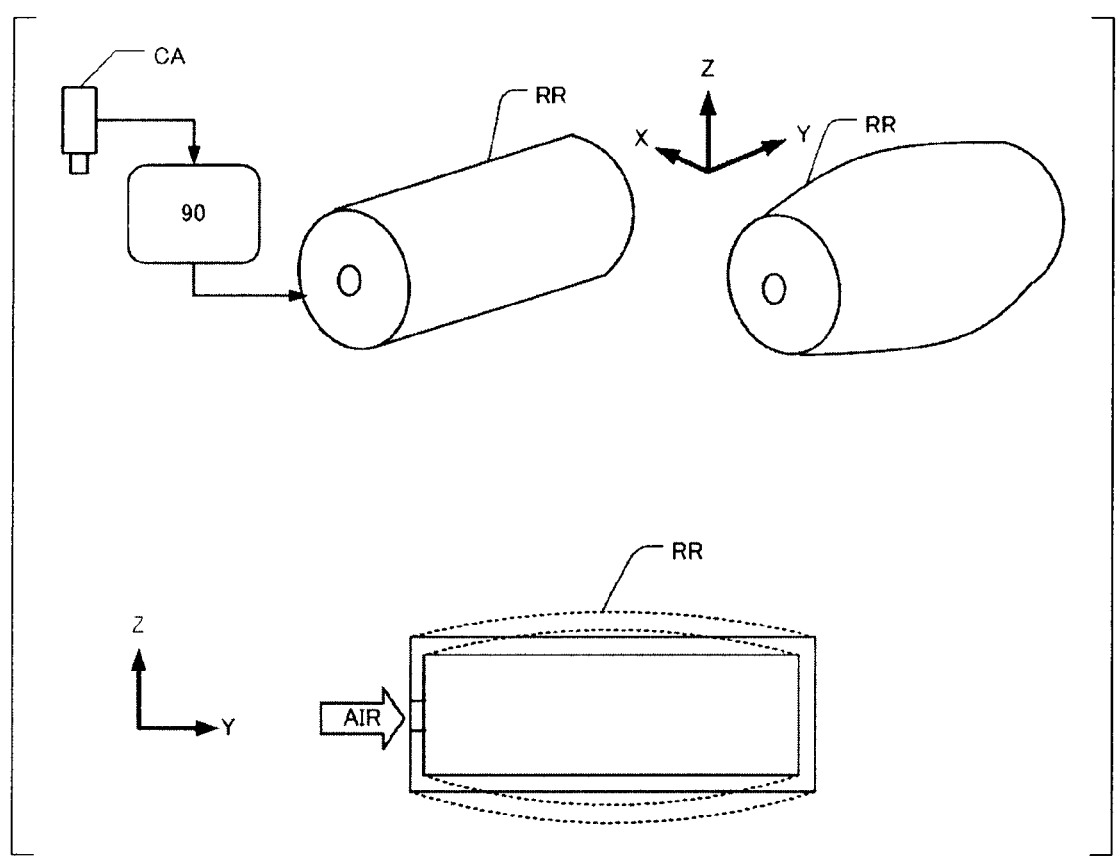
FIG. 13 shows a variation of the transportation roller.

FIG. 13 shows a modification of the transportation roller RR. As the length of the transportation roller RR increases in the axial direction thereof, the center portion of the transportation roller RR sags due to its own weight. For this reason, prepare a transportation roller RR in which the roller center is swollen by air pressure or hydraulic control. The main control section 90 determines whether or not the center portion is sagging by self weight based on a detection signal from the alignment camera CA, and can relieve the sag of the roller center by air or oil being supplied to the transportation roller RR.

In this present embodiment, a droplet applicator such as an ink jet and a cutting apparatus such as a laser were used, but in addition a printing applicator that uses a printing roller as a process apparatus or an exposure apparatus that performs exposure using infrared light can be used.

Embodiments of the present invention have been described above, but the present invention is not limited to these embodiments. Additions, omissions, substitutions, and other modifications of the constitution can be made without departing from the spirit of the present invention. The present inven-

The invention claimed is:

1. A method for manufacturing a display element using a flexible substrate that has a first surface, a second surface opposite the first surface, and first and second edges, the method comprising:
    transporting the flexible substrate, using a first transportation section, in a transporting direction perpendicular to a width of the flexible substrate;
    forming a plurality of first partition walls for the display element in the first surface, the first partition walls having a first depth;
    forming a plurality of second partition walls in the second surface in a region of the substrate that does not overlap with the first partition walls, the second partition walls having a second depth smaller than a thickness of the flexible substrate and larger than the first depth; and
    transporting the flexible substrate in the transporting direction using a second transportation section having a projection for engaging with the second partition walls.

2. The method for manufacturing the display element according to claim 1, wherein the second depth is approximately 10 times or more than the first depth.

3. The method for manufacturing the display element according to claim 1, wherein a shape of each of the second partition walls is a cross shape that extends in the transporting direction and along the width of the flexible substrate.

4. The method for manufacturing the display element according to claim 1, wherein a shape of each of the second partition walls is an inverted pattern shape that inverts a portion of a pattern of each of the first partition walls.

5. The method for manufacturing the display element according to claim 4, wherein the portion of the pattern of each of the first partition walls is at least one of a gate electrode line or a source electrode line.

6. The method for manufacturing the display element according to claim 1, wherein the first and second transportation sections comprise first and second rollers, and wherein the projection is provided in an outer periphery of the second roller, which is disposed adjacent to the second surface of the flexible substrate.

7. The method for manufacturing the display element according to claim 6, further comprising forming an electrode of the display element by applying a conductive member to a predetermined position between the first partition walls in a region in which the flexible substrate and the second roller are in contact.

8. The method for manufacturing the display element according to claim 7, further including:
    forming a plurality of alignment marks along the transporting direction of the flexible substrate.

9. The method for manufacturing the display element according to claim 8, wherein forming an electrode further comprises:
    forming images of the alignment marks; and
    applying the conductive member based on the images.

10. The method for manufacturing the display element according to claim 6, wherein the second roller has a heater portion, which plastically deforms the flexible substrate during forming of the first partition walls.

11. The method for manufacturing the display element according to claim 6, wherein the projection is a first projection, the second roller further includes a second projection and transporting the flexible substrate includes engaging both the first projection with a first trench and the second projection with a second trench adjacent the first trench in the transporting direction.

12. The method for manufacturing the display element according to claim 1, wherein the second partition walls comprise a plurality of trenches formed at a predetermined interval with respect to each of a width direction of the flexible substrate and a direction perpendicular to the width direction, wherein each of the plurality of trenches is formed in a region of the flexible substrate that does not overlap with the first partition walls.

13. A method for manufacturing a display element that forms the display element in a flexible substrate that has a first surface and a second surface opposite the first surface, the method comprising:
    forming a plurality of first partition walls for the display element in the first surface, the first partition walls having a first depth;
    forming a plurality of second partition walls in the second surface in a region of the substrate that does not overlap with the first partition walls, the second partition walls having a second depth smaller than a thickness of the flexible substrate and larger than the first depth; and
    performing a process at a predetermined position between the first partition walls where a transportation section that has a projection engages with the second partition walls.

14. The method for manufacturing the display element according to claim 13, wherein the transportation section transports the flexible substrate in a transporting direction perpendicular to a width of the flexible substrate.

15. The method for manufacturing the display element according to claim 13, wherein the second depth is approximately 10 times or more than the first depth.

16. The method for manufacturing the display element according to claim 13, wherein a shape of the second partition walls is an inverted pattern shape that inverts a portion of a pattern of the first partition walls.

17. The method for manufacturing the display element according to claim 13, wherein the transportation section has a heater portion that plastically transforms the flexible substrate during forming of the first partition walls.

18. A method for manufacturing a display element, comprising:
    forming electrodes by applying a conductive member to a predetermined position between first partition walls on a flexible substrate, the flexible substrate having a first surface and a second surface opposite the first surface, the first partition walls having a first depth and being formed in the first surface, and second partition walls having a second depth smaller than a thickness of the substrate and larger than the first depth and being formed in the second surface, wherein the second partition walls have shapes to engage with a transportation section; and
    transporting the flexible substrate in a transporting direction perpendicular to a width of the flexible substrate by a transportation section engaging with the second partition walls, wherein
    the second partition walls include a first trench at a first end of the width of the flexible substrate, a second trench at a second end of the width of the flexible substrate, and a third trench between the first end and the second end, and wherein
    the first trench, the second trench, and the third trench are formed in a region of the substrate that does not overlap with the first partition walls.

19. The method for manufacturing the display element according to claim 18, wherein the third trench is disposed approximately equidistant between the first trench and the second trench.

* * * * *